United States Patent
Haddock et al.

(10) Patent No.: US 9,608,559 B2
(45) Date of Patent: Mar. 28, 2017

(54) SLIDE FIT MOUNTING CLIP FOR INSTALLING PHOTOVOLTAIC MODULES

(71) Applicants: Robert M. M. Haddock, Colorado Springs, CO (US); Dustin M. M. Haddock, Colorado Springs, CO (US)

(72) Inventors: Robert M. M. Haddock, Colorado Springs, CO (US); Dustin M. M. Haddock, Colorado Springs, CO (US)

( * ) Notice: Subject to any disclaimer, the term of this patent is extended or adjusted under 35 U.S.C. 154(b) by 0 days.

(21) Appl. No.: 14/840,206

(22) Filed: Aug. 31, 2015

(65) Prior Publication Data

US 2016/0226433 A1   Aug. 4, 2016

Related U.S. Application Data

(63) Continuation of application No. 14/205,613, filed on Mar. 12, 2014, now Pat. No. 9,147,785.

(Continued)

(51) Int. Cl.

| E04D 13/18 | (2014.01) |
|---|---|
| E04H 14/00 | (2006.01) |
| H02S 20/23 | (2014.01) |
| H02S 20/00 | (2014.01) |
| H01L 31/048 | (2014.01) |
| F24J 2/52 | (2006.01) |
| E04D 3/366 | (2006.01) |
| F24J 2/00 | (2014.01) |

(52) U.S. Cl.
CPC ............ *H02S 20/23* (2014.12); *F24J 2/5211* (2013.01); *F24J 2/5247* (2013.01); *F24J 2/5249* (2013.01); *F24J 2/5254* (2013.01); *F24J 2/5262* (2013.01); *H01L 31/048* (2013.01); *H02S 20/00* (2013.01); *E04D 3/366* (2013.01); *F24J 2/526* (2013.01); *F24J 2/5245* (2013.01); *F24J 2/5258* (2013.01); *F24J 2002/0046* (2013.01); *F24J 2002/0069* (2013.01); *F24J 2002/522* (2013.01); *Y02B 10/12* (2013.01); *Y02B 10/20* (2013.01); *Y02B 10/50* (2013.01); *Y02E 10/47* (2013.01)

(58) Field of Classification Search
CPC ......... Y02B 10/20; Y02B 10/12; Y02E 10/47; Y02E 10/50; H02S 20/00
USPC .......................... 52/465–468, 460, 461, 463
See application file for complete search history.

(56) References Cited

U.S. PATENT DOCUMENTS

| 2,192,720 | A | * | 3/1940 | Tapman | ................. E04D 3/366 52/466 |
| 3,667,185 | A | * | 6/1972 | Maurer | ..................... E04D 3/24 52/478 |

(Continued)

*Primary Examiner* — Chi Q Nguyen
(74) *Attorney, Agent, or Firm* — Marsh Fischmann & Breyfogle LLP

(57) ABSTRACT

A module bracket includes first and second mounting clips (202, 204) that are spaced from each other along the pitch of a roofing surface. An inlet (212) to the first mounting clip (202) faces or projects in the general direction that the second mounting clip (204) is spaced from the first mounting clip (202). An inlet (212) to the second mounting clip (204) faces or projects in the general direction that the first mounting clip (202) is spaced from the second mounting clip (204). A second module flange (134) of a first photovoltaic module (120) is slid into the first mounting clip (202) of the module bracket. A first module flange (128) of a second photovoltaic module (120) is slid into the second mounting clip (204) of this same module bracket.

27 Claims, 38 Drawing Sheets

Related U.S. Application Data

(60) Provisional application No. 61/788,765, filed on Mar. 15, 2013.

(56) References Cited

U.S. PATENT DOCUMENTS

| | | | | | |
|---|---|---|---|---|---|
| 4,366,656 | A * | 1/1983 | Simpson | | E04D 3/366 52/395 |
| 4,393,859 | A * | 7/1983 | Marossy | | F24J 2/045 126/586 |
| 5,164,020 | A * | 11/1992 | Wagner | | E04D 3/366 136/244 |
| 5,409,549 | A * | 4/1995 | Mori | | E04D 3/366 136/244 |
| 5,557,903 | A * | 9/1996 | Haddock | | E04D 3/3607 52/408 |
| 6,269,596 | B1 * | 8/2001 | Ohtsuka | | E04D 3/366 126/621 |
| 6,370,828 | B1 * | 4/2002 | Genschorek | | F24J 2/5205 52/173.3 |
| 7,104,020 | B1 * | 9/2006 | Suttle | | E04D 3/366 52/478 |
| 8,375,654 | B1 * | 2/2013 | West | | F24J 2/5211 126/623 |
| 8,453,986 | B2 * | 6/2013 | Schnitzer | | F24J 2/5203 126/623 |
| D699,176 | S * | 2/2014 | Salomon | | D13/102 |
| 8,640,402 | B1 * | 2/2014 | Bilge | | E04D 3/405 136/251 |
| 8,752,338 | B2 * | 6/2014 | Schaefer | | F24J 2/5245 52/173.3 |
| 8,839,573 | B2 * | 9/2014 | Cusson | | F24J 2/5232 248/231.81 |
| 8,894,424 | B2 * | 11/2014 | DuPont | | F24J 2/4607 439/95 |
| 2002/0088196 | A1 * | 7/2002 | Haddock | | E04D 3/3608 52/543 |
| 2003/0015637 | A1 * | 1/2003 | Liebendorfer | | F24J 2/5205 248/237 |
| 2005/0115176 | A1 * | 6/2005 | Russell | | E04D 3/3608 52/220.1 |
| 2007/0131273 | A1 * | 6/2007 | Kobayashi | | F24J 2/5211 136/251 |
| 2008/0302928 | A1 * | 12/2008 | Haddock | | E04F 13/0821 248/205.1 |
| 2009/0194098 | A1 * | 8/2009 | Placer | | F24J 2/464 126/704 |
| 2010/0058701 | A1 * | 3/2010 | Yao | | E04D 13/12 52/547 |
| 2010/0154784 | A1 * | 6/2010 | King | | F24J 2/464 126/623 |
| 2010/0162641 | A1 * | 7/2010 | Reyal | | F24J 2/4614 52/173.3 |
| 2011/0078892 | A1 * | 4/2011 | Hartelius | | F24J 2/5232 29/469.5 |
| 2011/0154750 | A1 * | 6/2011 | Welter | | F24J 2/045 52/173.3 |
| 2011/0209745 | A1 * | 9/2011 | Korman | | F24J 2/5207 136/251 |
| 2011/0239546 | A1 * | 10/2011 | Tsuzuki | | F24J 2/4614 52/11 |
| 2011/0272545 | A1 * | 11/2011 | Liu | | E04D 13/12 248/222.14 |
| 2011/0314752 | A1 * | 12/2011 | Meier | | F24J 2/5211 52/173.3 |
| 2012/0073630 | A1 * | 3/2012 | Wu | | H02S 30/10 136/251 |
| 2012/0079781 | A1 * | 4/2012 | Koller | | F24J 2/5207 52/173.3 |
| 2012/0102853 | A1 * | 5/2012 | Rizzo | | F24J 2/5245 52/173.3 |
| 2012/0244729 | A1 * | 9/2012 | Rivera | | F24J 2/4638 439/97 |
| 2012/0298188 | A1 * | 11/2012 | West | | F24J 2/5211 136/251 |
| 2013/0168525 | A1 * | 7/2013 | Haddock | | E04D 13/10 248/505 |
| 2013/0313043 | A1 * | 11/2013 | Lallier | | E04G 3/265 182/45 |
| 2013/0340358 | A1 * | 12/2013 | Danning | | B23P 11/00 52/126.7 |
| 2014/0003861 | A1 * | 1/2014 | Cheung | | F24J 2/5256 403/291 |
| 2014/0179133 | A1 * | 6/2014 | Redel | | F24J 2/5207 439/121 |
| 2014/0283467 | A1 * | 9/2014 | Chabas | | E04D 3/30 52/173.3 |
| 2016/0111998 | A1 * | 4/2016 | Schmid | | F24J 2/5249 52/173.3 |

* cited by examiner

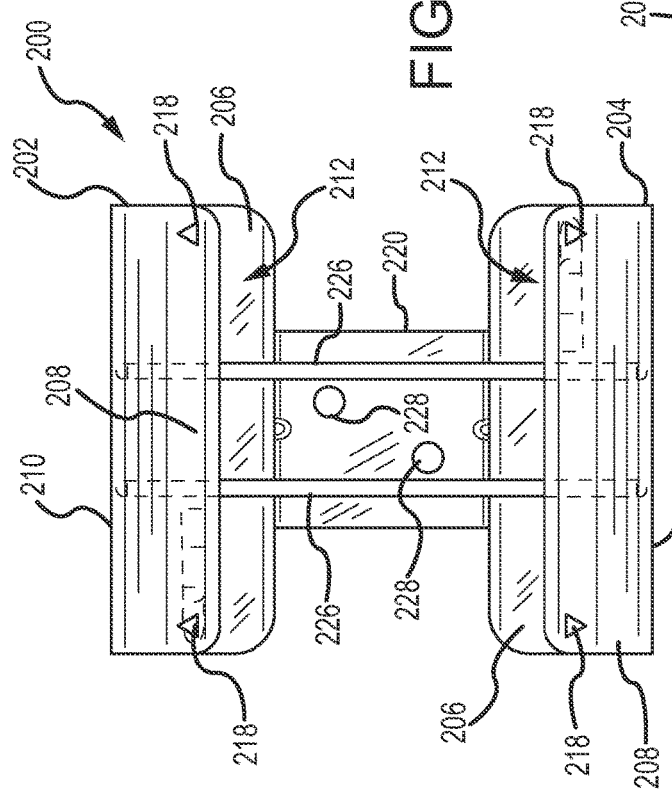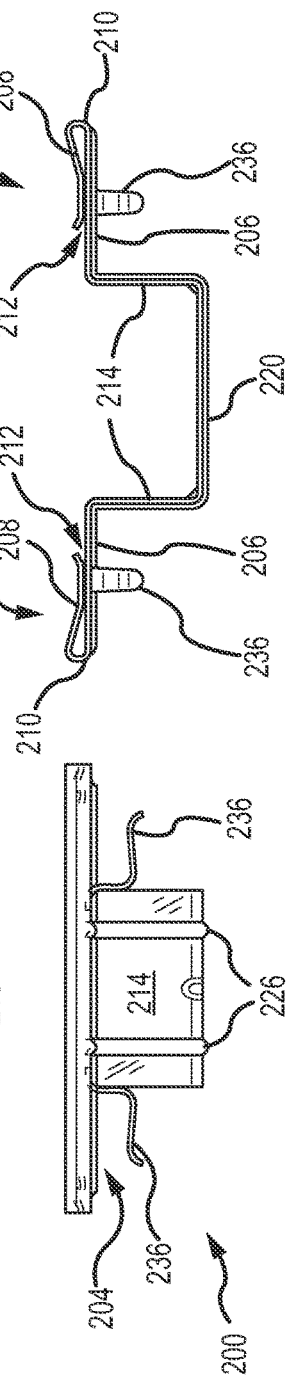

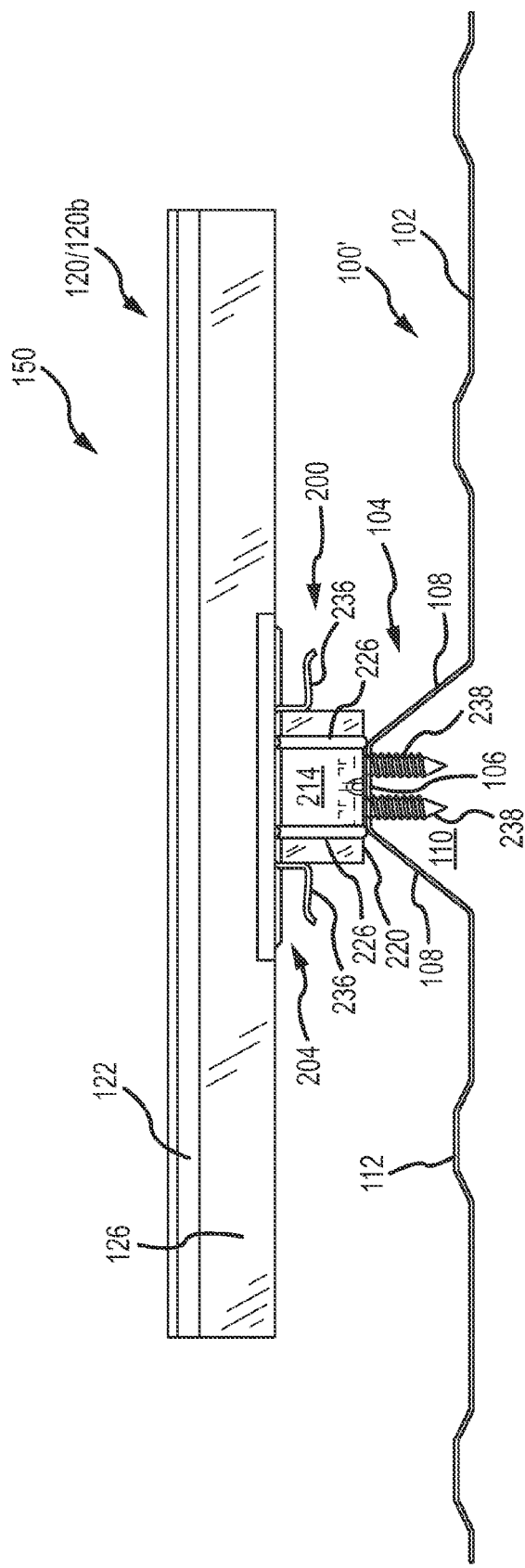

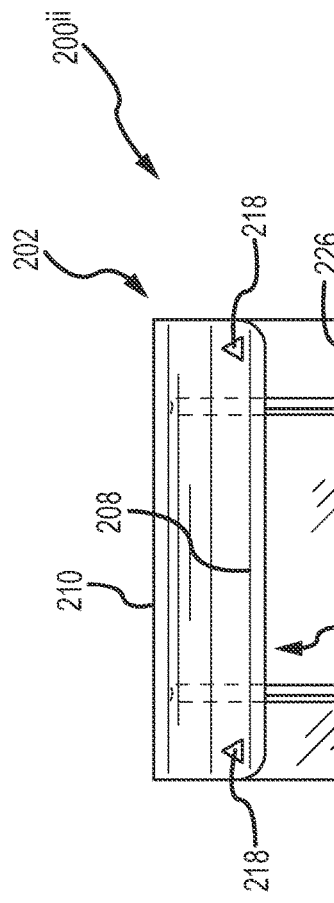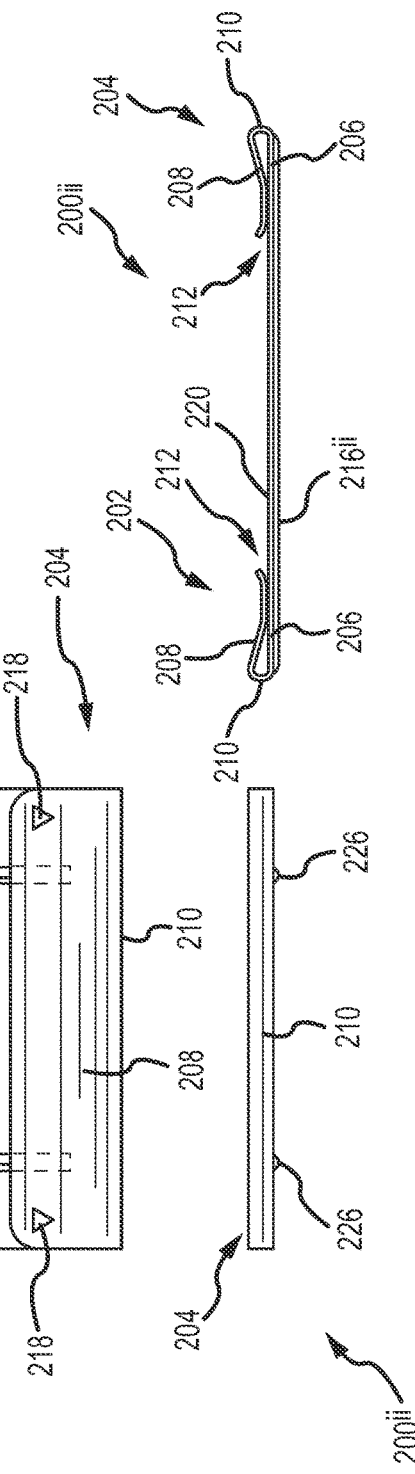
FIG. 4C
FIG. 4D
FIG. 4E

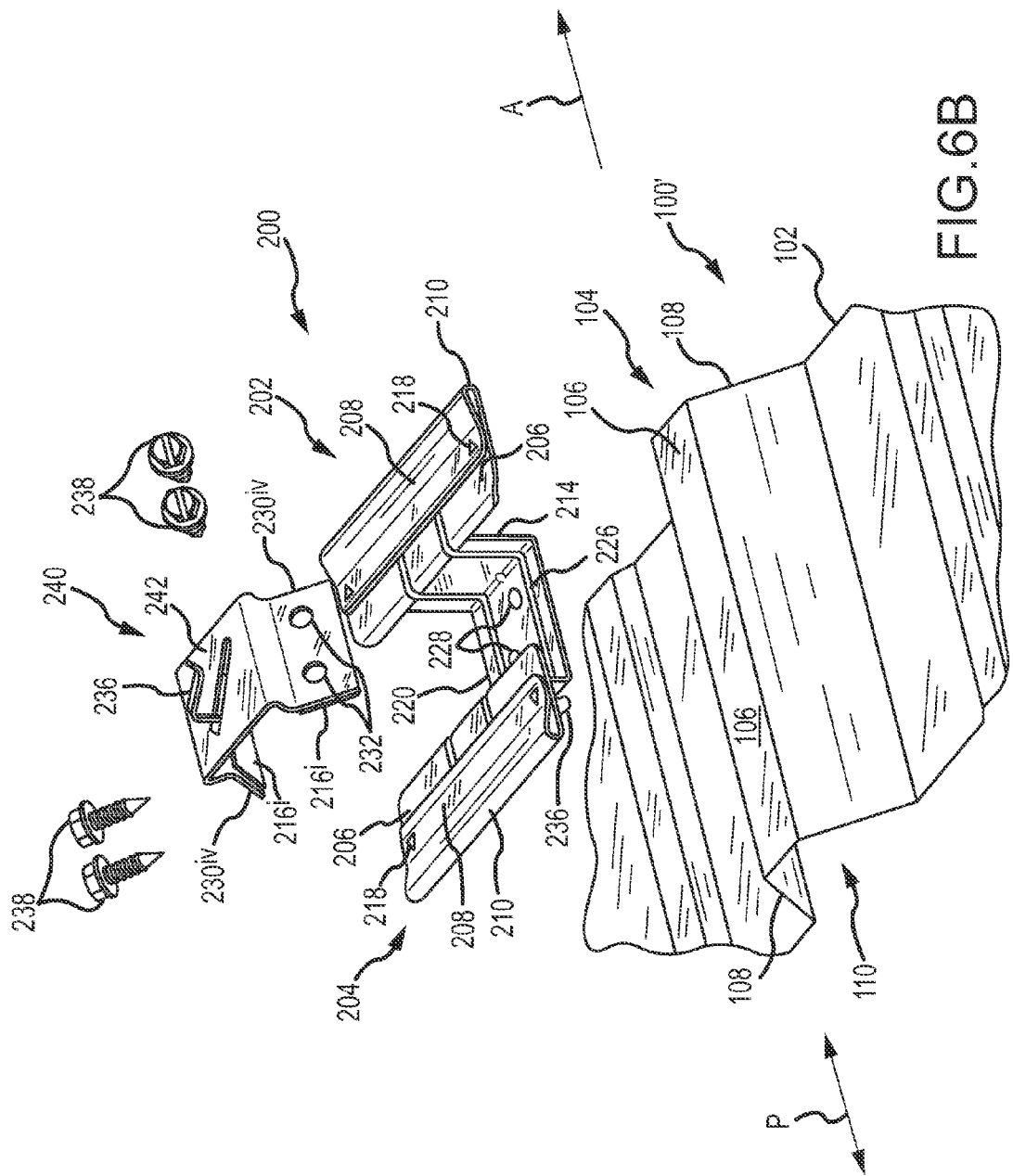

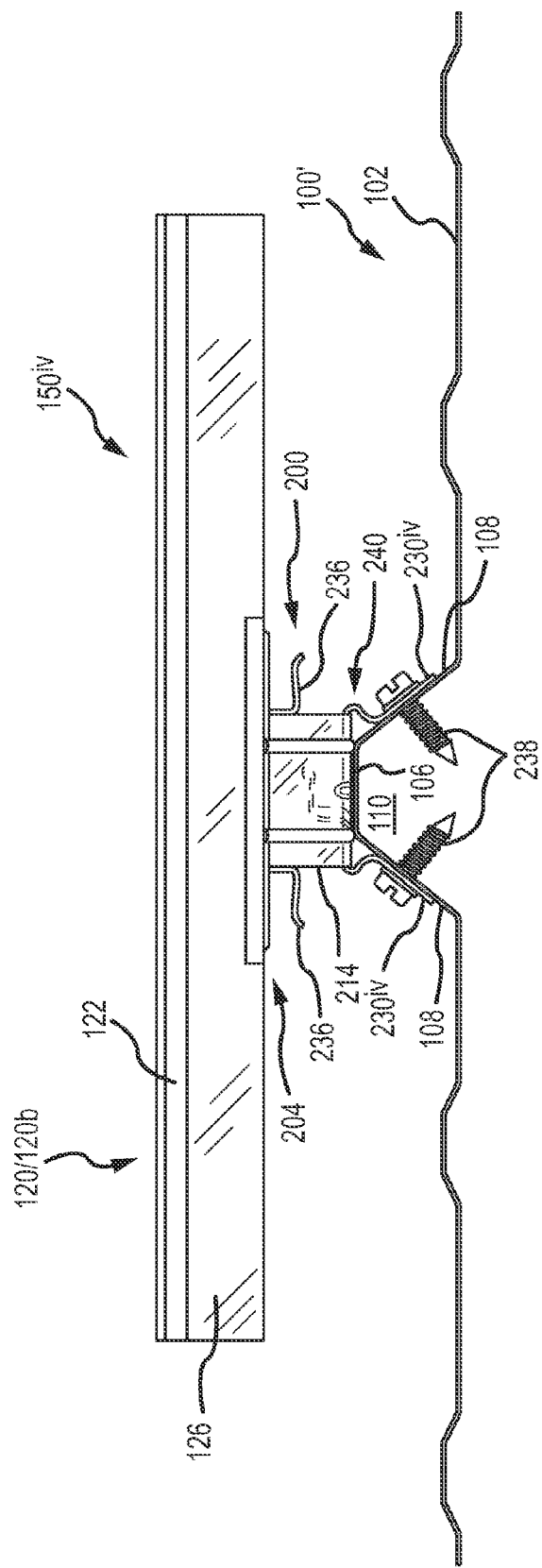

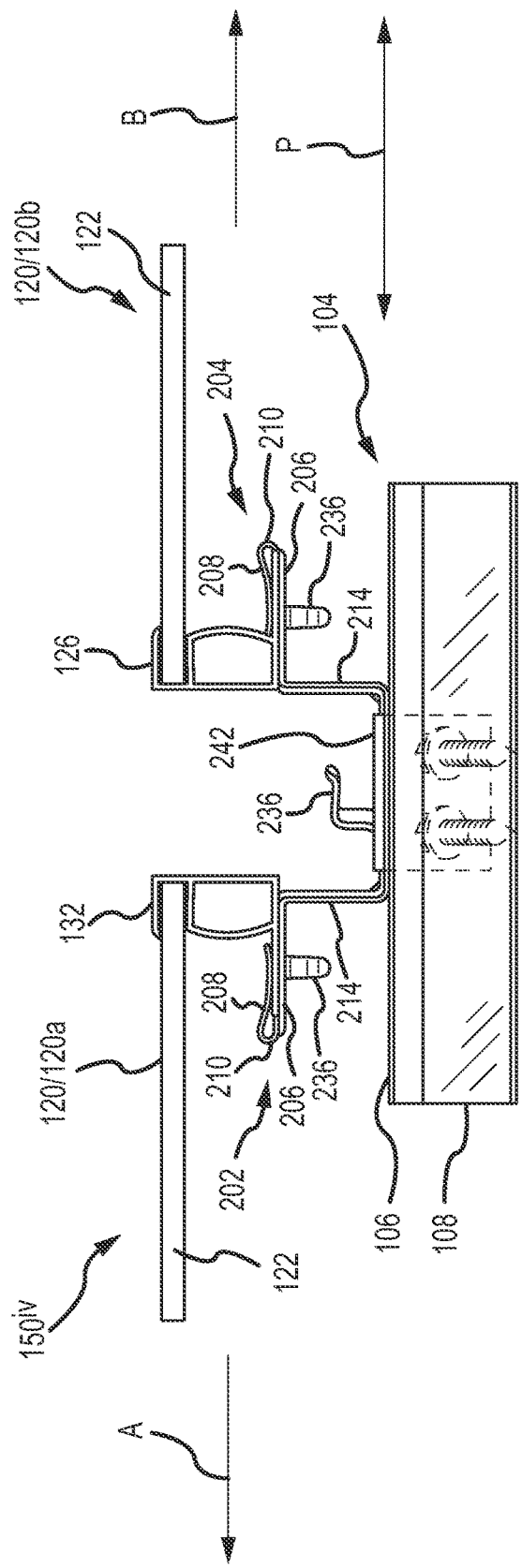

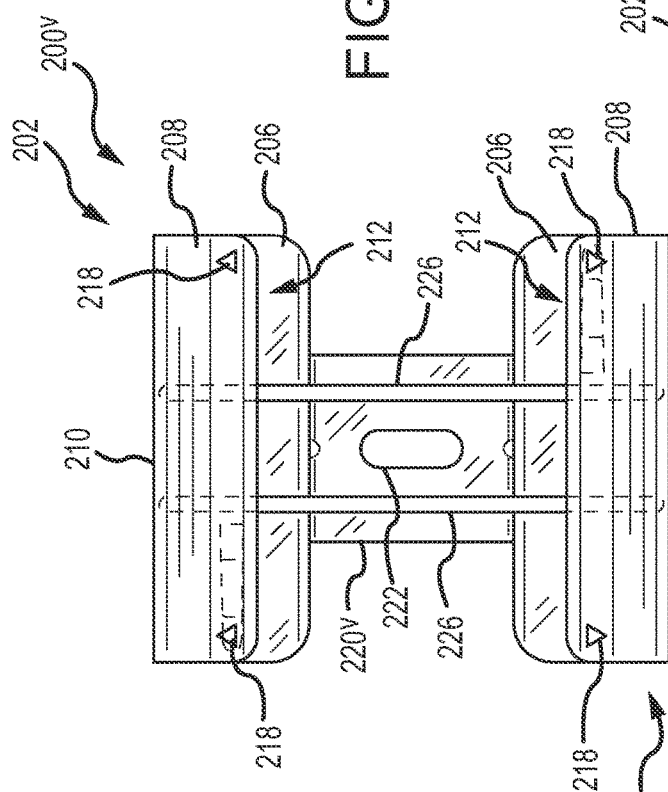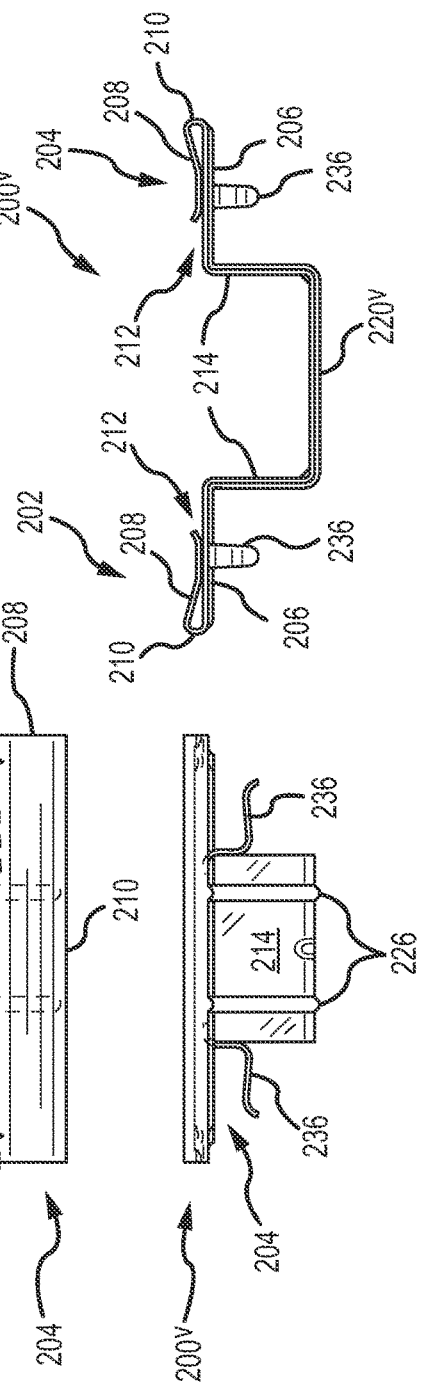

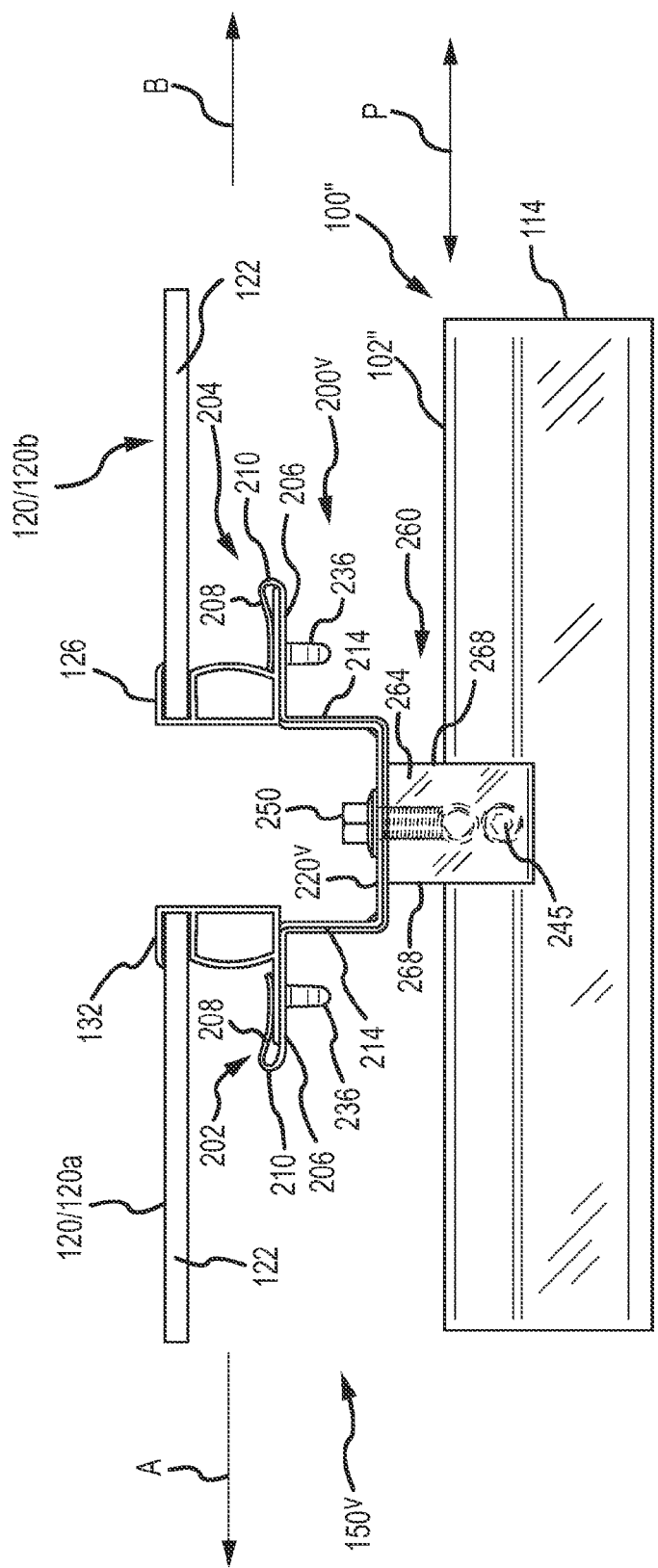

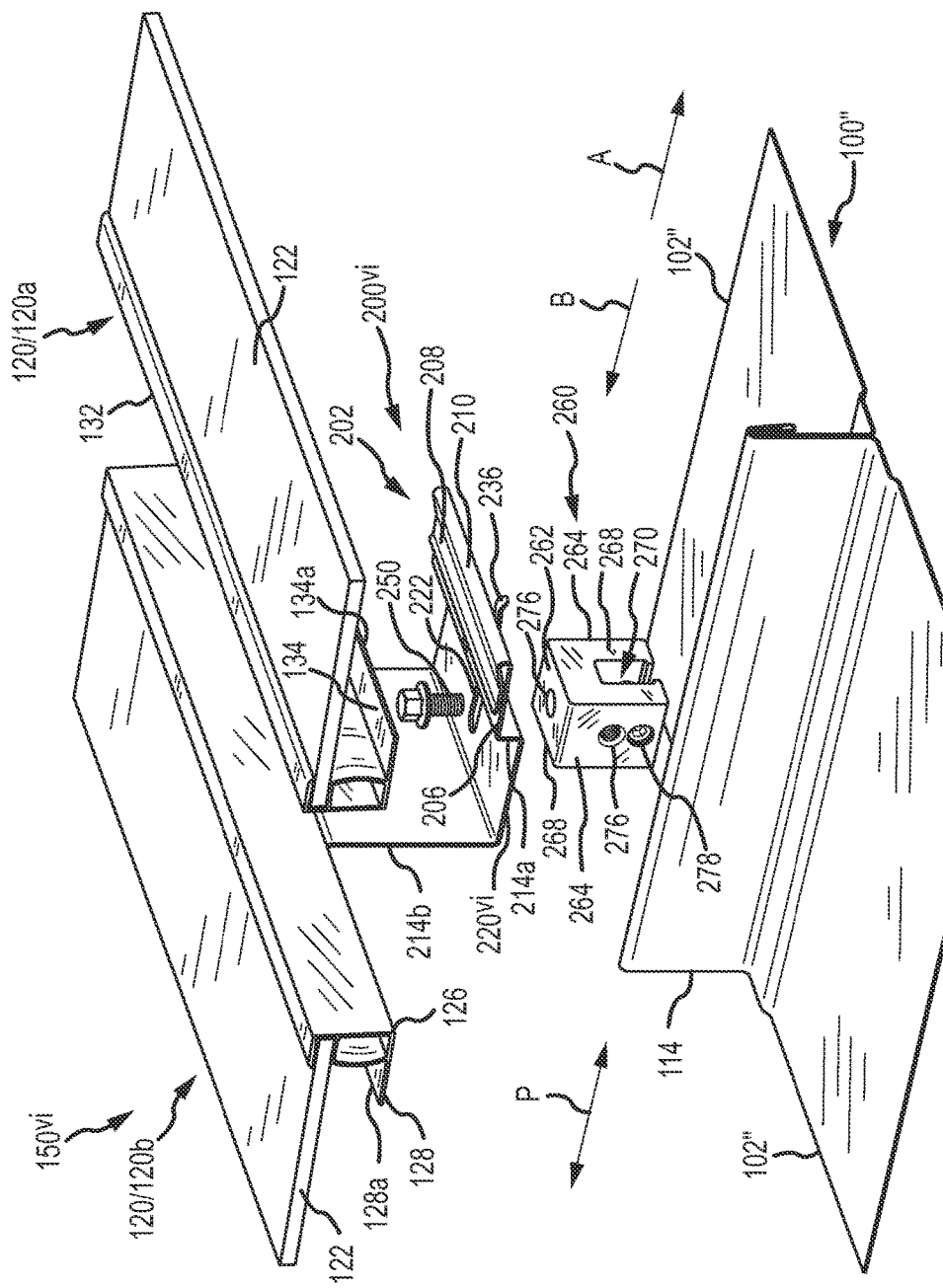

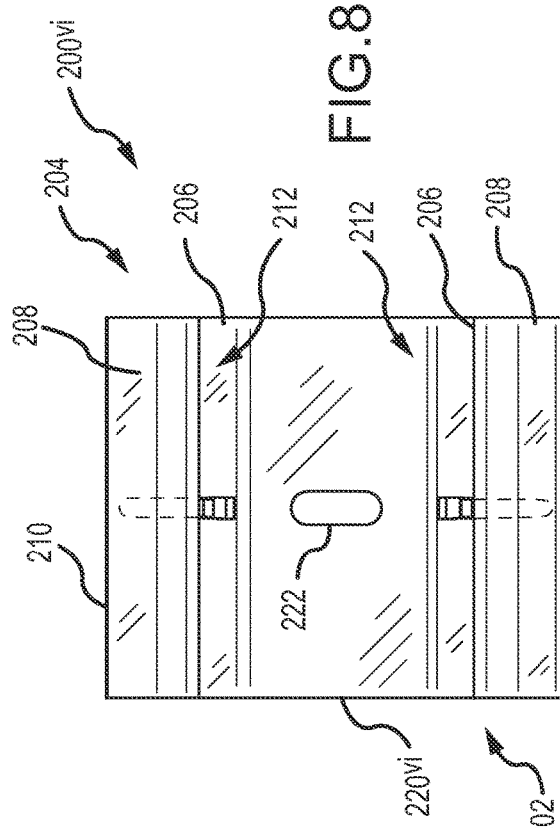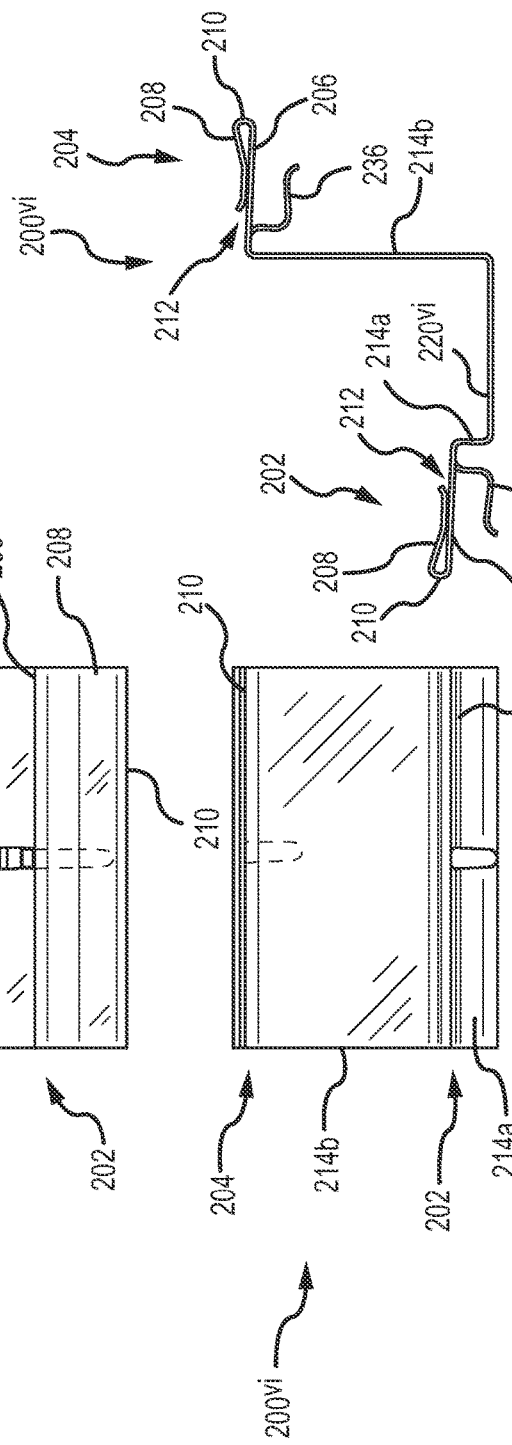

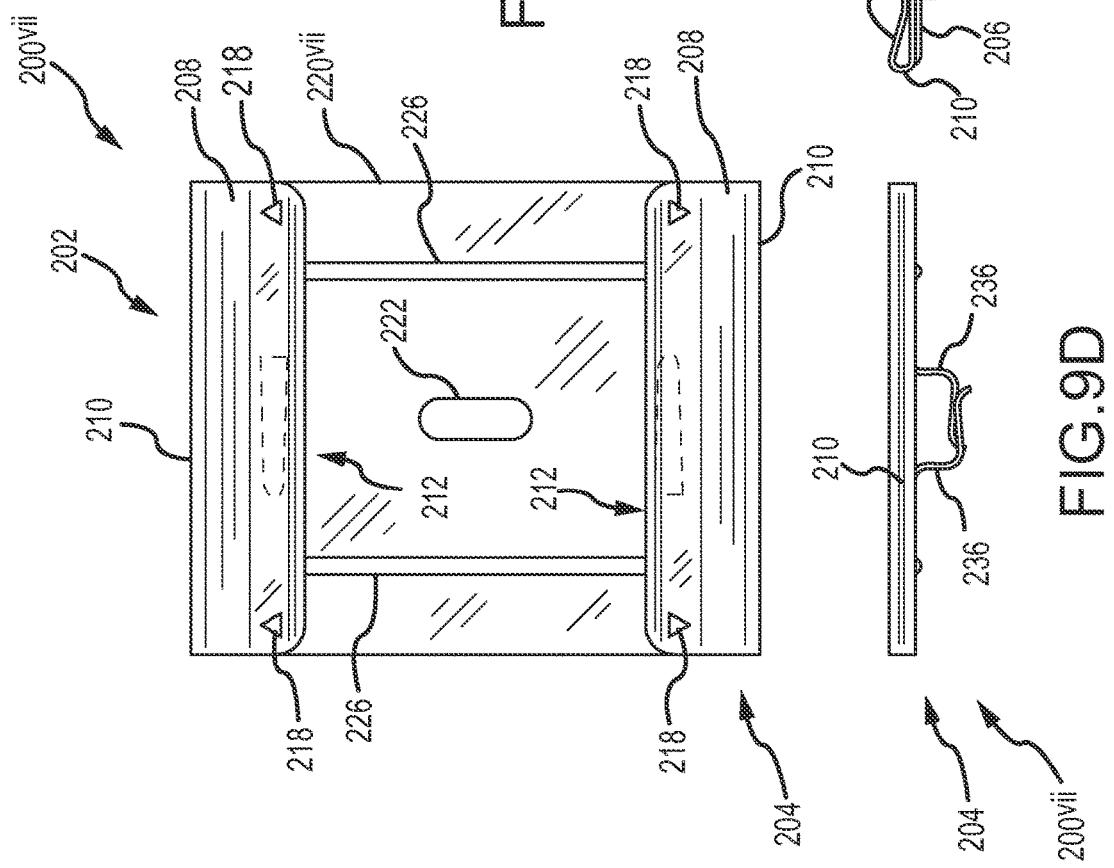

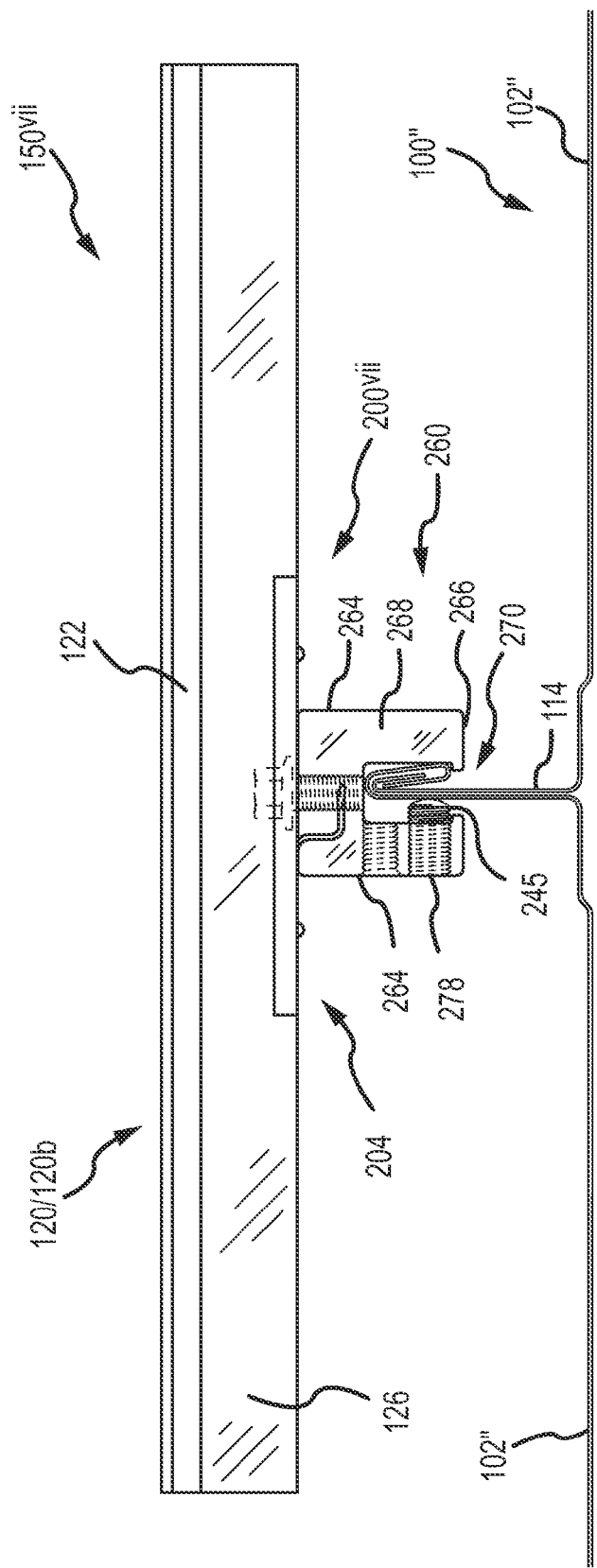

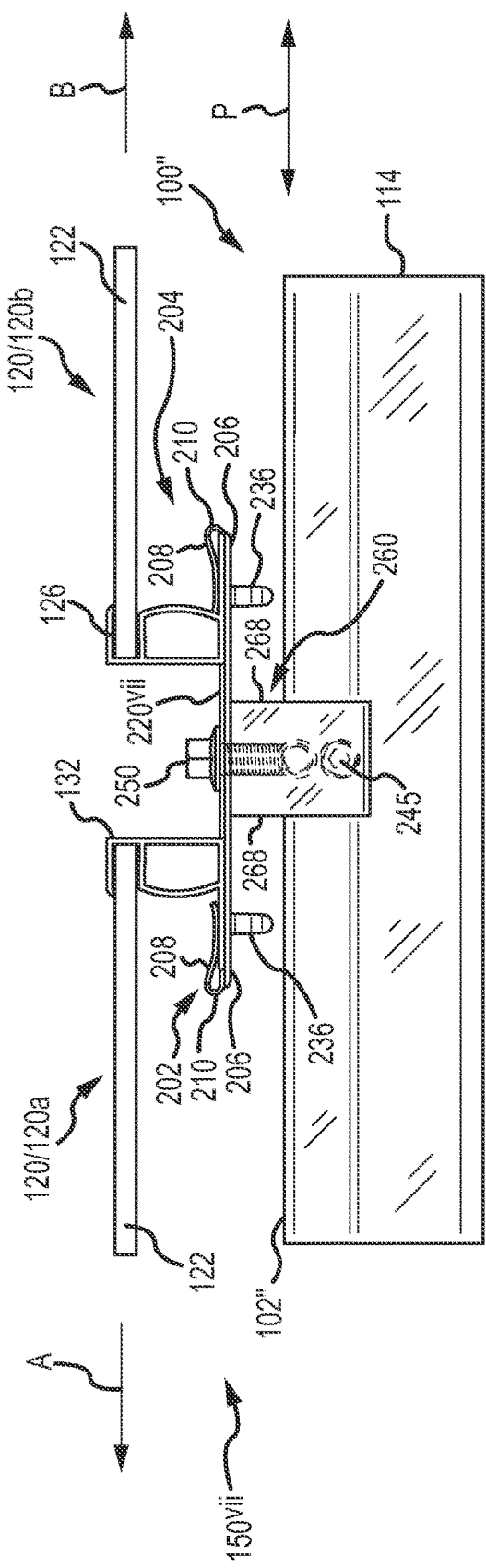

SLIDE FIT MOUNTING CLIP FOR INSTALLING PHOTOVOLTAIC MODULES

CROSS-REFERENCE TO RELATED APPLICATIONS

This patent application is a continuation of, and claims priority to, co-pending U.S. patent application Ser. No. 14/205,613, that is entitled "SLIDE FIT MOUNTING CLIP FOR INSTALLING PHOTOVOLTAIC MODULES," and that was filed on Mar. 12, 2014, which is a non-provisional patent application of, and claims priority to, U.S. Provisional Patent Application Ser. No. 61/788,765, that is entitled "SLIDE FIT MOUNTING CLIP FOR INSTALLING PHOTOVOLTAIC MODULES," that was filed on Mar. 15, 2013. The entire disclosure of each application set forth in this Cross-Reference to Related Applications section is hereby incorporated by reference.

FIELD

The present invention will generally relates to the field of photovoltaic systems and, more particularly, to devices for installing such photovoltaic systems on a building surface such as a roof.

BACKGROUND

Metal panels are being increasingly used to define building surfaces such as roofs and sidewalls. One type of metal panel is a standing seam panel, where the edges of adjacent standing seam panels of the building surface are interconnected in a manner that defines a standing seam. Standing seam panels are expensive compared to other metal panels, and building surfaces defined by metal panels may be more costly than other types of building surface constructions.

It is often desirable to install various types of structures on building surfaces, such as heating, air conditioning, and ventilation equipment. Installing structures on metal panel building surfaces in a manner that punctures the building surface at one or more locations is undesirable in a number of respects. One is simply the desire to avoid puncturing what can be a relatively expensive building surface. Another is that puncturing a metal panel building surface can present leakage and corrosion issues.

Photovoltaic or solar cells have existed for some time, and have been installed on various building roofs. A photovoltaic cell is typically incorporated into a perimeter frame of an appropriate material (e.g., aluminum) to define a photovoltaic module. Multiple photovoltaic modules may be installed in one or more rows on a roofing surface to define an array.

SUMMARY

A first aspect of the present invention is embodied by a photovoltaic assembly that includes a building surface, at least one module bracket, and at least one photovoltaic module. The module bracket may be interconnected with the building surface in a variety of manners (directly or indirectly), and includes first and second mounting clips that are spaced from one another. The first and second mounting clips include first and second inlets, respectively. The first inlet of the first mounting clip projects at least generally in a direction that the second mounting clip is spaced from the first mounting clip. Similarly, the second inlet of the second mounting clip projects at least generally in a direction that the first mounting clip is spaced from the second mounting clip.

A photovoltaic module for purposes of the first aspect includes a first frame section that is positioned on a first perimeter section of the photovoltaic module, along with a second frame section that is positioned on a second perimeter section of the photovoltaic module, where the first and second perimeter sections are located or positioned opposite of one another. The first frame section includes a first module flange that cantilevers at least generally in a direction of the second perimeter section for the photovoltaic module. The second frame section includes a second module flange that cantilevers at least generally in a direction of the first perimeter section for the photovoltaic module. In the case of the first aspect, the module bracket engages two different photovoltaic modules, which will hereafter be referred to as first and second photovoltaic modules. The second module flange of the first photovoltaic module extends through the first inlet for the first mounting clip of the module bracket and is engaged by this first mounting clip. The first module flange of the second photovoltaic module extends through the second inlet for the second mounting clip of the same module bracket and is engaged by this second mounting clip.

A number of feature refinements and additional features are applicable to the first aspect of the present invention. These feature refinements and additional features may be used individually or in any combination. The following discussion is applicable to the first aspect, up to the start of the discussion of a second aspect of the present invention.

The building surface for purposes of the first aspect may be in the form of a roofing surface. The first and second frame sections of the first photovoltaic module, along with the first and second frame sections of the second photovoltaic module, may be disposed and/or extend at least generally transverse to a pitch of this roofing surface on which the first and second photovoltaic modules are being installed (e.g., the length dimension of the first and second perimeter sections (the largest dimension of the first and second perimeter sections for the photovoltaic modules) may be disposed at a constant elevation when proceeding along the roofing surface, for instance defining the top edge and bottom edge of the respective first and second photovoltaic modules in the installed position). The first frame section of the first photovoltaic module may be disposed upslope of both the second frame section for the first photovoltaic module (having its second module flange engaged by the first mounting clip of the module bracket), and an entirety of the second photovoltaic module. That is, the first frame section of the first photovoltaic module may be disposed in an upslope direction relative to both the second frame section for the same first photovoltaic module, and furthermore the first frame section of the first photovoltaic module may be disposed in an upslope direction relative to an entirety of the second photovoltaic module. The first frame section of the second photovoltaic module (having its first module flange engaged by the second mounting clip of the same module bracket) may be disposed upslope of the second frame section of this same second photovoltaic module. That is, the first frame section of the second photovoltaic module may be disposed in an upslope direction relative to the second frame section for this same second photovoltaic module. As noted and in the case of the first aspect, the second module flange of the first photovoltaic module (on the second frame section of the first photovoltaic module) is engaged by the first mounting clip of the module bracket, whereas the first module flange of the second photovoltaic module (on the first frame section of the second photovoltaic module) is engaged by the second mounting clip of the module bracket.

The first and second mounting clips for the module bracket may be characterized as being spaced along a pitch of the building surface (e.g., the first mounting clip may be disposed at a higher elevation on the building surface than its corresponding second mounting clip; the first mounting clip of the module bracket may be disposed in an uphill or upslope direction relative to the second mounting clip of the same module bracket when installed on the building surface). The module bracket may be configured such that the first and second mounting clips each may be disposed in at least substantially parallel relation to a pitch of the building surface. The position/orientation of the first and second mounting clips is subject to a number of additional characterizations. One configuration of the module bracket is such that the first and second mounting clips are disposed in at least substantially coplanar relation relative to one another, and furthermore such that the first and second mounting clips are disposed directly on the building surface (or such that the first and second mounting clips are disposed directly on a gasket, which is in turn disposed directly on the building surface). Another configuration of the module bracket is such that the first and second mounting clips are disposed in at least substantially coplanar relation relative to one another, and furthermore such that the first and second mounting clips are each disposed in vertically spaced relation to the building surface (e.g., offset by a distance of at least about 0.5 inches from the underlying building surface). Yet another configuration of the module bracket is that the first and second mounting clips are each disposed in vertically spaced relation to the building surface (e.g., offset by a distance of at least about 0.5 inches from the underlying building surface), but where the first and second mounting clips are vertically offset from the building surface by different amounts (e.g., the first and second mounting clips each may be spaced from the underlying building surface, but the second mounting clip may be spaced further from the underlying building surface than the first mounting clip).

The first and second mounting clips may be of a common configuration. Each of the first and second mounting clips may include first and second sections, with the second section overlying its corresponding first section. The first inlet associated with the first mounting clip may be characterized as an opening or an openable portion between the first and second sections of the first mounting clip. A first slide fit may exist between the second module flange of the first photovoltaic module and the first mounting clip. The free end of the second module flange (opposite of its fixed end) may be introduced into the first inlet, and may be moved in a direction of a first closed end of the first mounting clip to dispose the second module flange (first photovoltaic module) within the first mounting clip (the first inlet and the first closed end of the first mounting clip may define opposite ends thereof).

The second inlet associated with the second mounting clip may be characterized as an opening or an openable portion between the first and second sections of the second mounting clip. A second slide fit may exist between the first module flange of the second photovoltaic module and the second mounting clip. The free end of the first module flange (opposite of its fixed end) may be introduced into the second inlet, and may be moved in a direction of a second closed end of the second mounting clip to dispose the first module flange (second photovoltaic module) within the second mounting clip (the second inlet and the second closed end of the second mounting clip may define opposite ends thereof).

There may be a living hinge (e.g., an arcuately-shaped, elastically-deformable, pliable portion) located between and interconnecting the first and second sections for each of the first and second mounting clips. The second section of each of the first and second mounting clips may be characterized as being deflectable away from its corresponding first section (e.g., the second section of the first mounting clip may at least generally move away from the first section of the first mounting clip by an elastic deformation of an interconnecting portion of the first mounting clip, for instance the noted living hinge; the second section of the second mounting clip may move away from the first section of the second mounting clip by an elastic deformation of an interconnecting portion of the second mounting clip, for instance the noted living hinge).

The first and second sections of the first mounting clip (module bracket) may be engaged prior to receiving the second module flange of the first photovoltaic module, may be spaced from one another when receiving the second module flange of the first photovoltaic module, or both. In one embodiment, the second section of the first mounting clip is biased in the direction of the first section of the first mounting clip. Similarly, the first and second sections of the second mounting clip (module bracket) may be engaged prior to receiving the first module flange of the second photovoltaic module, may be spaced from one another when receiving the first module flange of the second photovoltaic module, or both. In one embodiment, the second section of the second mounting clip is biased in the direction of the first section of the second mounting clip.

The module bracket may include a base section that is located or positioned between the first and second mounting clips. One embodiment has the base section and the first section for each of the first and second mounting clips all being disposed in at least substantially coplanar relation to one another. Another embodiment has the first and second mounting clips being at least substantially coplanar with one another, but where the first and second mounting clips are each offset from and at a higher elevation than the base section. Yet another embodiment has each of the first and second mounting clips being offset from and at a higher elevation than the base section, but where the first and second mounting clips are offset relative to the base section by different amounts (e.g., the second mounting clip may be disposed at a higher elevation relative to the base section, compared to the elevation of the first mounting clip relative to the base section). Each of these module bracket configurations may be utilized, regardless of how the module bracket is actually installed on/relative to the building surface (whether by a direct-mounting configuration or an indirect-mounting configuration).

The above-noted base section of the module bracket may be positioned directly on an uppermost section of a hollow rib for the building surface. The base section of the module bracket could also be positioned directly on a gasket, which in turn is positioned directly on an uppermost section of a hollow rib for the building surface. In either case, at least one threaded fastener may extend through the base section, through the uppermost section of the hollow rib, and may terminate within an interior space of the hollow rib (e.g., to directly attach the module bracket to the building surface).

The module bracket may include first and second bracket flanges that are disposed on opposite sides of the above-noted base section. The first bracket flange may be disposed against/along at least part of a first side of a hollow rib incorporated by the building surface, and the second bracket flange may be disposed against/along at least part of a second side of this same hollow rib. A separate gasket could be disposed between each of the bracket flanges of the module bracket and the hollow rib. At least one threaded fastener may extend through the first bracket flange (module bracket) and the first side of the hollow rib (and through any intermediate gasket), and may terminate within the hollow interior of the rib. At least one threaded fastener may extend through the second bracket flange (module bracket) and the second side of the hollow rib (and through any intermediate gasket), and may terminate within the hollow interior of the rib. In this direct-mounting configuration, the base section could incorporate one or more wiring clips.

An included angle between the noted base section and the noted first bracket flange of the module bracket (relative to surfaces thereof that face or project toward the hollow rib on which the module bracket is installed) may be obtuse (e.g., greater than 90° and less than 180°). An included angle between the noted base section and the noted second bracket flange of the module bracket (relative to surfaces thereof that face or project toward the hollow rib on which the module bracket is installed) may be obtuse (e.g., greater than 90° and less than 180°). The first and second bracket flanges may each be permanently anchored relative to (or disposed in a fixed position relative to) the base section, including where the module bracket is a non-piece construction.

Another option for disposing the module bracket in a fixed position relative to the building surface is to use a separate panel bracket that is disposed over the above-noted base section of the module bracket (e.g., the base section of the module bracket would then be located between the panel bracket and the building surface), and to attach this panel bracket to the building surface. Such a panel bracket may include first and second bracket flanges. The first bracket flange of the panel bracket may be disposed against/along at least part of a first side of a hollow rib incorporated by the building surface, and the second bracket flange of the panel bracket may be disposed against/along at least part of a second side of this same hollow rib. A separate gasket could be disposed between each of the bracket flanges of the panel bracket and the hollow rib. At least one threaded fastener may extend through the first bracket flange (panel bracket) and the first side of the hollow rib (and any intermediate gasket), and may terminate within the hollow interior of the rib. At least one threaded fastener may extend through the second bracket flange (panel bracket) and the second side of the hollow rib (and any intermediate gasket), and may terminate within the hollow interior of the rib.

The noted panel bracket may include a cap section that is located between the noted first and second bracket flanges of the panel bracket. This cap section of the panel bracket may interface with the base section of the module bracket, or the cap section of the panel bracket and the base section of the module bracket may be disposed in closely-spaced and opposing relation. In either case, the base section of the module bracket is captured between the cap section of the panel bracket and a hollow rib on which the module bracket is positioned. This cap section for the panel bracket could incorporate one or more wiring clips. An included angle between the cap section and the first bracket flange of the panel bracket (relative to surfaces thereof that face or project toward a rib on which the module bracket and panel bracket are installed) may be obtuse (e.g., greater than 90° and less than 180°). An included angle between the cap section and the second bracket flange of the panel bracket (relative to surfaces thereof that face or project toward a rib on which the module bracket is installed) may be obtuse (e.g., greater than 90° and less than 180°).

The module bracket may be interconnected with the building surface by a mounting device (e.g., an indirect-mounting configuration). The mounting device may be attached to the building surface, the module bracket may be positioned on this mounting device (e.g., the above-noted base section), and at least one threaded fastener may extend through the module bracket and into the mounting device (including where this threaded fastener(s) is threadably engaged with the mounting device). In one embodiment, the building surface includes a standing seam, and the mounting device is installed on such a standing seam.

Contact between the module bracket and the first photovoltaic module may be limited to the first mounting clip engaging the second module flange of the first photovoltaic module, contact between the module bracket and the second photovoltaic module may be limited to the second mounting clip engaging the first module flange of the second photovoltaic module, or both. An entirety of a retention force exerted by the module bracket on the first photovoltaic module may be provided by the first mounting clip, an entirety of a retention force exerted by the module bracket on the second photovoltaic module may be provided by the second mounting clip, or both. The first mounting clip may exert a compressive force on the second module flange of the first photovoltaic module, the second mounting clip may exert a compressive force on the first module flange of the second photovoltaic module, or both.

The module bracket may incorporate one or more "electrical" or electrically-related features. Generally, the module bracket may include at least one wiring clip—a structure that may be used to support one or more wires used by the photovoltaic assembly. Each of the first and second mounting clips for the module bracket may include one or more wiring clips. In one embodiment, at least one of the first mounting clip and the second mounting clip includes a wiring clip on the underside thereof and that is spaced from the underlying building surface—the surface of the respective mounting clip that faces or projects in the direction of the building surface on which the module bracket is installed may include one or more wiring clips.

The first mounting clip may incorporate at least one electrical contact, and the second mounting clip may also incorporate at least one electrical contact. The electrical contact(s) incorporated by the first mounting clip may be used to establish electrical connectivity between the first mounting clip and the second module flange of the first photovoltaic module. The electrical contact(s) incorporated by the second mounting clip may be used to establish electrical connectivity between the second mounting clip and the first module flange of the second photovoltaic module.

The noted electrical contacts for the first and second mounting clips may be characterized as providing electrical continuity between adjacent photovoltaic modules that are engaged by a common module bracket (e.g., an electrical path may encompass the frame of one photovoltaic module, one or more electrical contacts of the first mounting clip engaged with a corresponding module flange of this photovoltaic module, one or more electrical contacts of the second mounting clip engaged with a corresponding module flange of another photovoltaic module, and the frame of this other photovoltaic module). This may be referred to in the art as "bonding." In any case, the electrical contacts may be used in providing a grounding function for a corresponding photovoltaic module(s). The noted electrical connection provided by the electrical contacts of the mounting clips may be used to electrically connect adjacent photovoltaic modules (e.g., those engaged by a common module bracket), and which may be used to provide an electrical path to ground a string or collection of photovoltaic modules.

Each electrical contact that is incorporated by the first and/or second mounting clip may be in the form of a cantilever. Such a cantilevered electrical contact may extend from an upper section of the corresponding mounting clip in the direction of a corresponding lower section of the corresponding mounting clip, and furthermore may extend in the direction of a closed end of the corresponding mounting clip to a free end of the cantilevered electrical contact (which may contact the associated module flange).

A second aspect of the present invention is directed to a method of installing photovoltaic modules using a plurality of module brackets (where each module bracket includes first and second mounting clips that are spaced from one another) and a plurality of photovoltaic modules (where each photovoltaic module includes first and second module flanges). A first module bracket is anchored relative to a building surface. A first photovoltaic module is moved in a first direction of decreasing elevation, and includes sliding the first module flange of the first photovoltaic module into the second mounting clip of the first module bracket. The first mounting clip of the first module bracket is disposed in a second direction of increasing elevation relative to the second mounting clip of this same first module bracket.

A second module bracket is installed on the first photovoltaic module by sliding the first mounting clip of this second module bracket onto the second module flange of the first photovoltaic module. The second module bracket is also anchored relative to the building surface and in a position such that the second module bracket is disposed in the first direction of decreasing elevation relative to the first module bracket. The first mounting clip of the second module bracket is disposed in the second direction of increasing elevation relative to the second mounting clip of this same second module bracket. A second photovoltaic module is moved in the first direction of decreasing elevation, and includes sliding the first module flange of the second photovoltaic module into the second mounting clip of the second module bracket.

A number of feature refinements and additional features are applicable to the second aspect of the present invention. These feature refinements and additional features may be used individually or in any combination. The following discussion is applicable to at least the second aspect of the present invention. The building surface may be in the form of a roofing surface. The first direction of decreasing elevation may correspond with a direction of decreasing slope proceeding along a pitch of this roofing surface, while the second direction of increasing elevation may correspond with a direction of increasing slope proceeding along the pitch of this roofing surface.

The module brackets that are used by the second aspect may be in accordance with the module bracket discussed above in relation to the first aspect, including the manner of installing such a module bracket on a building surface. The anchoring of the first and second module brackets may include directly attaching the module brackets to the building surface, for instance by directing one or more panel fasteners through the corresponding module bracket, and through a hollow rib on which the module bracket is positioned, including where each such panel fastener terminates within the hollow interior of this rib. An indirect mounting configuration may be used as well, such as where a mounting device is attached to a standing seam of the building surface, and where a module bracket is attached to this mounting device (e.g., using one or more threaded fasteners).

The first module bracket may be anchored relative to the building surface before sliding the first module flange of the first photovoltaic module into the second mounting clip of the first module bracket, before the second module bracket is anchored relative to the building surface, or both. The second module bracket may be installed on the first photovoltaic module (by sliding the second module flange of the first photovoltaic module into the first mounting clip of the second module bracket) prior to installing the first module bracket on the first photovoltaic module (by sliding the first module flange of the first photovoltaic module into the second mounting clip of the first module bracket). If the second module bracket is installed on the first photovoltaic module (by sliding the second module flange of the first photovoltaic module into the first mounting clip of the second module bracket) after the first module bracket has been installed on the first photovoltaic module (by sliding the first module flange of the first photovoltaic module into the second mounting clip of the first module bracket), this installation may entail moving the second module bracket in the second direction of increasing elevation.

Installing a module bracket on a photovoltaic module may entail directing a module flange into one of the mounting clips of a particular module bracket, and which may entail expanding this mounting clip. Relative movement between such a module bracket and photovoltaic module may continue until an end of the module flange (photovoltaic module) engages a closed end of the corresponding mounting clip for the corresponding module bracket.

After the second module bracket has been installed on the second module flange of the first photovoltaic module, the second module bracket may be slid along the length dimension of this second module flange, for instance to align the second module bracket with a particular rib of the building surface. Once the second module bracket is in the desired position relative to the building surface and with the second module flange of the first photovoltaic module being received within the first mounting clip of the second module bracket (including after any repositioning of the second module bracket along the second module flange of the first photovoltaic module), the second module bracket may be anchored relative to the building surface. After the second module bracket has been anchored relative to the building surface, the second photovoltaic module may be moved in the first direction of decreasing elevation to slide the first module flange of the second photovoltaic module into the second mounting clip of the anchored second module bracket.

More than one first module bracket may be used to engage the first photovoltaic module. In one embodiment, a plurality of first module brackets are disposed in a first row along the building surface (e.g., where this first row extends across the pitch of the building surface or transversely to this pitch) and are separately anchored relative to the building surface. The movement of the first photovoltaic module in the first direction of decreasing elevation may then entail sliding the first module flange of the first photovoltaic module simultaneously into the second mounting clip of a plurality of anchored first module brackets.

More than one second module bracket may be used to engage each of the first and second photovoltaic modules. In one embodiment, a plurality of second module brackets are positioned on the second module flange of the first photovoltaic module (e.g., by the noted sliding action), and are then each separately anchored relative to the building surface in a second row along the building surface (e.g., where this second row extends across the pitch of the building surface or transversely to this pitch). Thereafter, the second photovoltaic module may be moved in the first direction of decreasing elevation to simultaneously slide the first module flange of the second photovoltaic module into the second mounting clip of a plurality of second module brackets.

Any feature of any other various aspects of the present invention that is intended to be limited to a "singular" context or the like will be clearly set forth herein by terms such as "only," "single," "limited to," or the like. Merely introducing a feature in accordance with commonly accepted antecedent basis practice does not limit the corresponding feature to the singular (e.g., indicating that a mounting clip includes "an electrical contact" alone does not mean that the mounting clip includes only a single electrical contact). Moreover, any failure to use phrases such as "at least one" also does not limit the corresponding feature to the singular (e.g., indicating that a mounting clip includes "an electrical contact" alone does not mean that the mounting clip includes only a single electrical contact). Use of the phrase "at least generally" or the like in relation to a particular feature encompasses the corresponding characteristic and insubstantial variations thereof (e.g., indicating that the first and second mounting clips are at least generally coplanar encompasses the first and second mounting clips actually being coplanar). Finally, a reference of a feature in conjunction with the phrase "in one embodiment" does not limit the use of the feature to a single embodiment.

BRIEF DESCRIPTION OF THE FIGURES

FIG. 2E is a top view of the module bracket used by the photovoltaic assembly of FIG. 2A.

FIG. 2F is an end view of the module bracket used by the photovoltaic assembly of FIG. 2A, looking in the up-slope direction.

FIG. 2G is a side view of the module bracket used by the photovoltaic assembly of FIG. 2A.

FIG. 2K is a cutaway view of the photovoltaic assembly of FIG. 2A, taken transversely to the pitch of the roofing surface, and looking in the up-slope direction.

FIG. 4C is a top view of the module bracket used by the photovoltaic assembly of FIG. 4A.

FIG. 4D is an end view of the module bracket used by the photovoltaic assembly of FIG. 4A, looking in the up-slope direction.

FIG. 4E is a side view of the module bracket used by the photovoltaic assembly of FIG. 4A.

FIG. 6B is an exploded, perspective view of the separate module bracket and panel bracket used by the photovoltaic assembly of FIG. 6A.

FIG. 6K is a cutaway view of the photovoltaic assembly of FIG. 6A, taken transversely to the pitch of the roofing surface, and looking in the up-slope direction.

FIG. 6L is a side view of the photovoltaic assembly of FIG. 6A, with the module flanges of each photovoltaic module being engaged by its corresponding mounting clip of the module bracket.

FIG. 7C is a top view of the module bracket used by the photovoltaic assembly of FIG. 7A.

FIG. 7D is an end view of the module bracket used by the photovoltaic assembly of FIG. 7A, looking in the up-slope direction.

FIG. 7E is a side view of the module bracket used by the photovoltaic assembly of FIG. 7A.

FIG. 7G is a side view of the photovoltaic assembly of FIG. 7A, with the module flanges of each photovoltaic module being engaged by its corresponding mounting clip of the module bracket.

FIG. 8A is an exploded, perspective view of one embodiment of a photovoltaic assembly installed on a standing seam roofing surface, where the photovoltaic assembly uses an adaptation of the module bracket from the photovoltaic assembly of FIG. 5.

FIG. 8C is a top view of the module bracket used by the photovoltaic assembly of FIG. 8A.

FIG. 8D is an end view of the module bracket used by the photovoltaic assembly of FIG. 8A, looking in the down-slope direction.

FIG. 8E is a side view of the module bracket used by the photovoltaic assembly of FIG. 8A.

FIG. 9C is a top view of the module bracket used by the photovoltaic assembly of FIG. 9A.

FIG. 9D is an end view of the module bracket used by the photovoltaic assembly of FIG. 9A, looking in the up-slope direction.

FIG. 9E is a side view of the module bracket used by the photovoltaic assembly of FIG. 9A.

FIG. 9F is a cutaway view of the photovoltaic assembly of FIG. 9A, taken transversely to the pitch of the roofing surface, and looking in the up-slope direction.

FIG. 9G is a side view of the photovoltaic assembly of FIG. 9A, with the module flanges of each photovoltaic module being engaged by its corresponding mounting clip of the module bracket.

DETAILED DESCRIPTION

Figure 1:
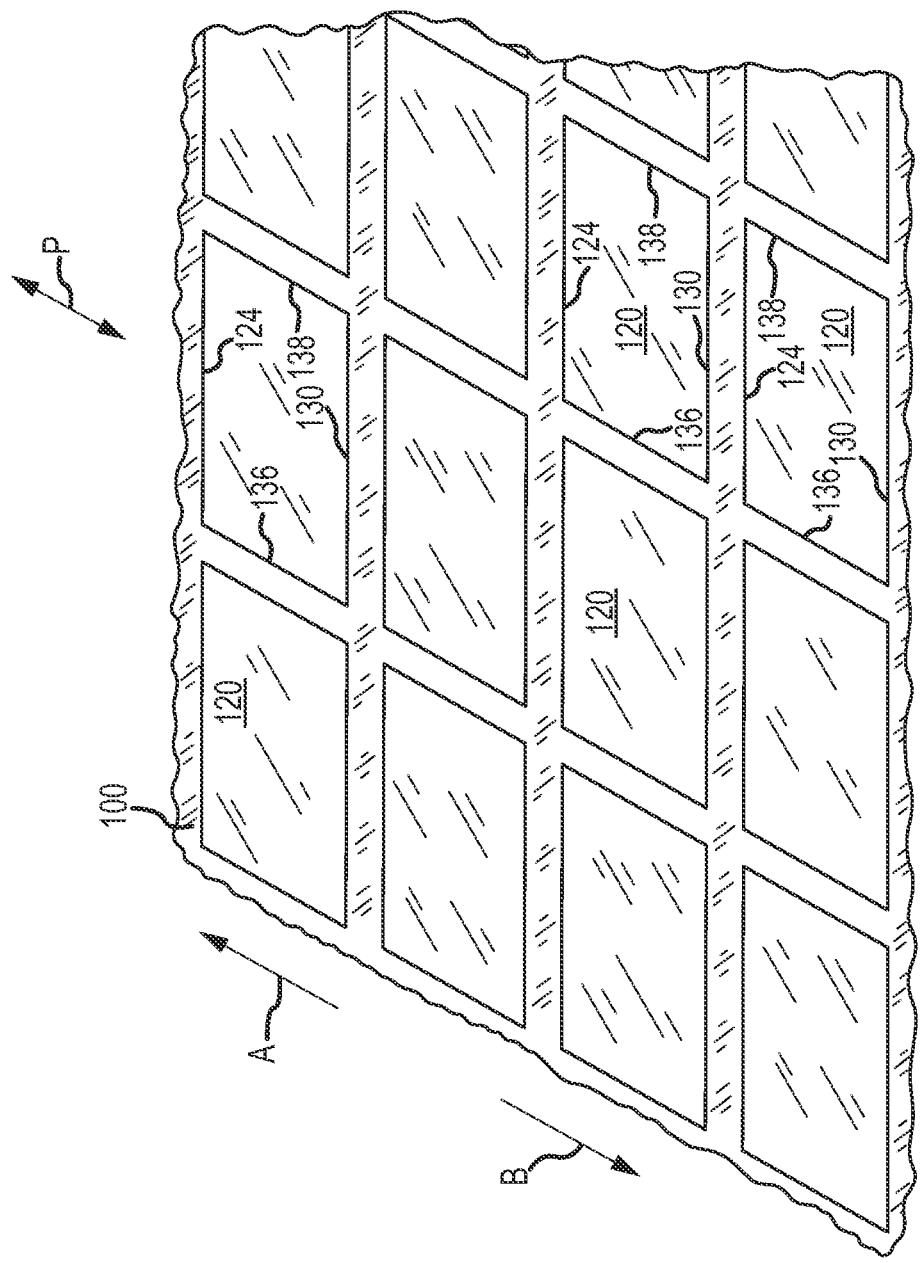
FIG. 1 illustrates a plurality of photovoltaic modules positioned on a roofing surface.

FIG. 1 presents a portion of a building surface 100. The building surface 100 may be of any appropriate type (e.g., a siding or roofing surface of a building) and may be defined in any appropriate manner (e.g., by a plurality of interconnected metal panels). In the illustrated embodiment, the building surface 100 is in the form of a roofing surface 100. In this regard, the roofing surface 100 has a pitch P (a slope or incline, the direction or orientation of which is indicated by the double-headed arrow in FIG. 1). As used herein, the arrow A identifies the direction of increasing slope (e.g., the "uphill" direction, the direction of increasing elevation along the roofing surface 100, or the up-slope direction). Conversely, the arrow B identifies the direction of decreasing slope (e.g., the "downhill" direction, the direction of decreasing elevation along the roofing surface 100, or the down-slope direction).

A plurality of photovoltaic modules 120 are positioned on the roofing surface 100 presented in FIG. 1. Each photovoltaic module 120 may be of any appropriate shape. In the illustrated embodiment, each photovoltaic module 120 is rectangular and is installed in a landscape orientation (with the long dimension of each photovoltaic module 120 being disposed transversely to the pitch P of the roofing surface 100). However, the photovoltaic modules 120 could be installed in a portrait orientation on the roofing surface 100. Typically the photovoltaic modules 120 will be installed in a plurality of rows and columns on the roofing surface 100.

Each photovoltaic module 120 may be characterized as including a first perimeter section 124 (e.g., an upper edge or end of the photovoltaic module 120 when installed on the roofing surface 100), an oppositely disposed second perimeter section 130 (e.g., a lower edge or end of the photovoltaic module 120 when installed on the roofing surface 100), a third perimeter section 136 (e.g., a left edge or end of the photovoltaic module 120 when installed on the roofing surface 100), and an oppositely disposed fourth perimeter section 138 (e.g., a right edge or end of the photovoltaic module 120 when installed on the roofing surface 100). As will be addressed in more detail below, a frame may extend about the entire perimeter of each photovoltaic module 120.

One embodiment of a photovoltaic assembly 150 that is installed on a building surface 100' is presented in FIGS. 2A-L. In this case, the building surface 100' is in the form of a roofing surface 100' having a pitch P, where again the arrow A identifies the up-slope direction and where the arrow B identifies the down-slope direction. The roofing surface 100' presented in FIGS. 2A-L is defined by a plurality of panels 102 that are appropriately interconnected (e.g., one edge or edge portion of one panel 102 may be disposed in overlapping/nesting relation with an adjacent panel 102 in the same row). Each panel 102 includes at least one rib 104, and may include one or more other structures such as one or more minor ribs 112 or the like. The ribs 104 of each panel 102 are disposed in at least substantially parallel relation and extend in the direction of the pitch P of the roofing surface 100' (e.g., the length dimension of each rib 104 may be disposed at the same pitch as the pitch P of the overall roofing surface 100').

The ribs 104 of the panels 102 that collectively define the roofing surface 100' may be of any appropriate configuration. In the illustrated embodiment, the ribs 104 are commonly referred to in the art as trapezoidal ribs 104. Other configurations may be appropriate. In any case, each rib 104 may be characterized as having an end section 106 (e.g., a flat surface; an uppermost portion of the rib 104 when defining the roofing surface 100'). Two sidewalls 108 extend downwardly from the opposite sides of the end section 106 for each rib 104 (e.g., the two sidewalls 108 may be characterized as being spaced in a lateral dimension that is orthogonal to the pitch dimension, where the lateral and pitch dimensions are disposed within a common plane). The end section 106 and its two sidewalls 108 collectively define a hollow interior 110 for the corresponding rib 104. An interior angle (e.g., measured within the hollow interior 110 of a given rib 104) between the end section 106 and each of the sidewalls 108 is greater than 90° (an obtuse angle) for the configuration of the ribs 104 presented in FIGS. 2A-L.

The portion of the photovoltaic assembly 150 presented in FIGS. 2A-L includes a module bracket 200 and a corresponding pair of photovoltaic modules 120. It should be appreciated that the photovoltaic assembly 150 may include any appropriate number of photovoltaic modules 120 and any appropriate number of module brackets 200. Each module bracket 200 may include any appropriate number of wiring clips 236 (e.g., for supporting one or more wires used by the photovoltaic assembly 150). Each module bracket 200 may also be formed from any appropriate material or combination of materials (e.g., a metal or a metal alloy, and including from an electrically conductive material).

A given module bracket 200 of the photovoltaic assembly 150 may engage a single photovoltaic module 120, or a given module bracket 200 could simultaneously engage two different photovoltaic modules 120 (e.g., adjacently disposed modules 120). In this regard, the module bracket 200 includes a first mounting clip 202 (for engaging one photovoltaic module 120) and a separate second mounting clip 204 (for engaging a different photovoltaic module 120). The first mounting clip 202 and the second mounting clip 204 of a given module bracket 200 are spaced along the rib 104 on which the module bracket 200 is mounted (e.g., the first mounting clip 202 and the second mounting clip 204 are spaced along the pitch P of the roofing surface 100', with the first mounting clip 202 being disposed up-slope of its corresponding second mounting clip 204).

Each of the mounting clips 202, 204 may be characterized as including a first section 206 and a second section 208 that is disposed above or in overlying relation to its corresponding first section 206. One end of each of the mounting clips 202, 204 is "open" and may be characterized as an inlet 212 to the corresponding mounting clip 202, 204. An opposite end of each of the mounting clips 202, 204 is "closed" and may be characterized as an end section 210. Each mounting clip 202, 204 may be characterized as being at least generally U-shaped or of a "money clip" configuration.

The second section 208 of each mounting clip 202, 204 may be in contact with its corresponding first section 206 prior to receiving a portion of a photovoltaic module 120 being installed on the corresponding mounting clip 202, 204. In any case, the spacing between the first section 206 of each mounting clip 202, 204 and its corresponding second section 208 increases when a corresponding portion of a photovoltaic module 120 is installed on the corresponding mounting clip 202, 204. This "expansion" of the mounting clips 202, 204 may be realized by a flexing or bending (e.g., an elastic deformation) of the corresponding mounting clip 202, 204, may be characterized as a deflection of the second section 208 at least generally away from its corresponding first section 206, or both. For instance, the end section 210 of each mounting clip 202, 204 may be characterized as a "living hinge" that allows relative movement between its corresponding first section 206 and second section 208. In one embodiment, the end section 210 of each mounting clip 202, 204 may be characterized as being an arcuately-shaped, pliable section that is located between its corresponding first section 206 and second section 208, and that allows for a desired relative movement between its corresponding first section 206 and corresponding second section 208 (e.g., that allows the second section 208 of a given mounting clip 202, 204 to at least generally pivot away from and back toward its corresponding first section 206).

At least part of the second section 208 of each mounting clip 202, 204 may at least at some point in time be biased toward its corresponding first section 206. This biasing force may be provided by the end section 210 of the corresponding mounting clip 202, 204 (e.g., an elastic configuration). During at least a portion of the movement of the second section 208 away from its corresponding first section 208, the amount of the biasing force may progressively increase (e.g., by an elastic "flexing" of the corresponding end section 210). Although a biasing force could be exerted on the second section 208 when engaged with its corresponding first section 206, such is not required.

Each mounting clip 202, 204 of each module bracket 200 may mechanically engage and support a photovoltaic module 120 on the roofing surface 100'. The mounting clips 202, 204 may also be used to establish an electrical connection with a corresponding photovoltaic module 120. In this regard, the surface of the second section 208 that faces or projects toward its corresponding first section 206 may include one or more projections 218 (e.g., having one or more "sharp" edges; an electrical contact). When a photovoltaic module 120 is installed in a given mounting clip 202, 204, the module 120 may be characterized as being "bonded" or electrically bonded to the corresponding mounting clip 202, 204 (or more generally as being bonded to the module bracket 200) via these projections 218. As two photovoltaic modules 120 may be installed on a given module bracket 200, an electrical path between these two modules 120 may be provided by such a module bracket 200. A string or collection of photovoltaic modules 120 may therefore be electrically connected (e.g., disposed at a common electrical potential) via the associated module brackets 200 (e.g., an electrical path may include the frames of the various photovoltaic modules 120 in the string, along with the corresponding module brackets 200 that engage these frames). This electrical path may be used to ground the string or collection of photovoltaic modules 120 (e.g., by running a single grounding wire from the frame of one of the photovoltaic modules 120 in the string to ground, as each adjacent pair of modules 120 in the string may be electrically interconnected by a shared module bracket 200).

Figure 2A:
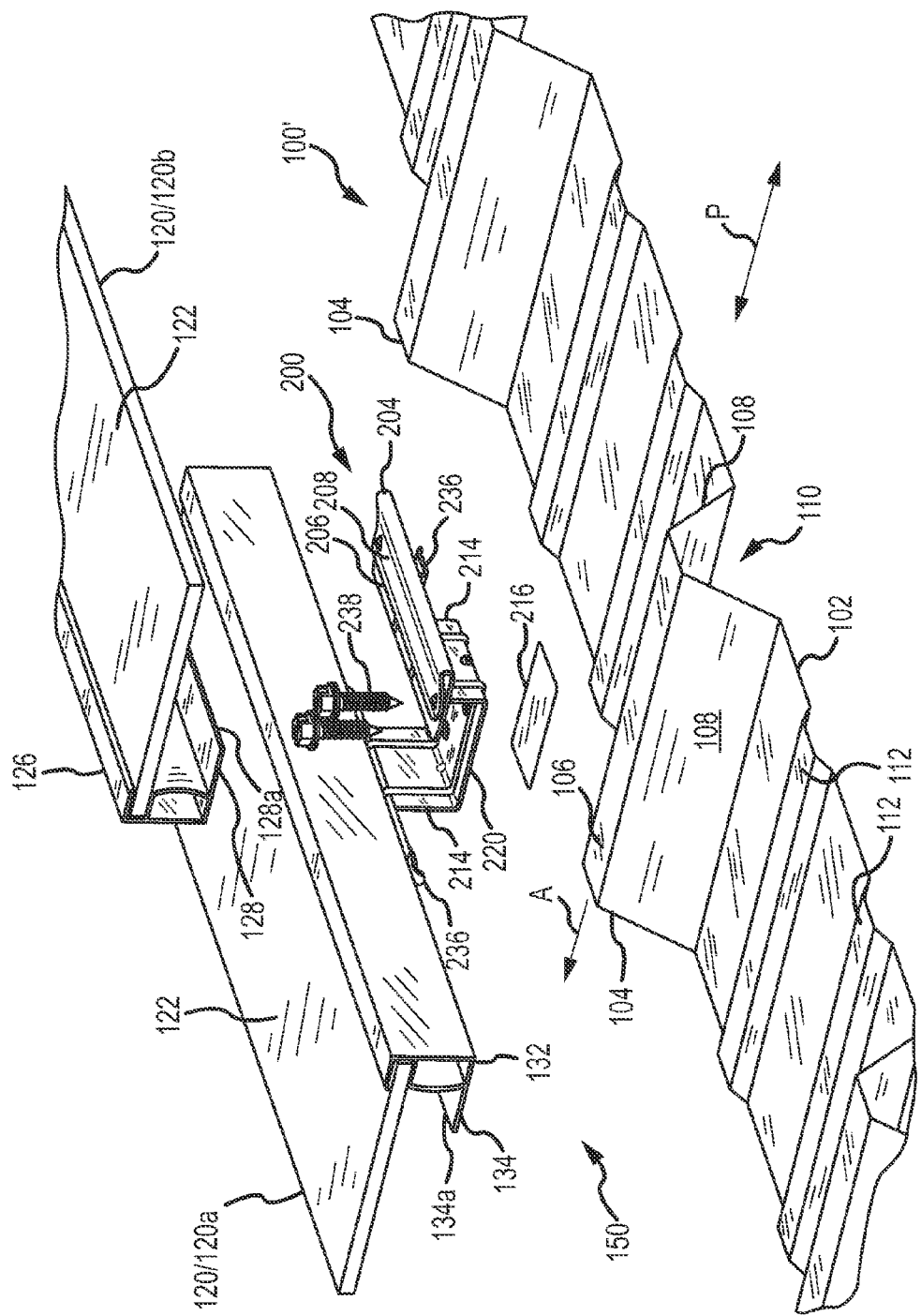
FIG. 2A is an exploded, perspective view of one embodiment of a photovoltaic assembly installed on a roofing surface defined by trapezoidal rib panels, where the photovoltaic assembly uses one embodiment of a module bracket.
Figure 2B:
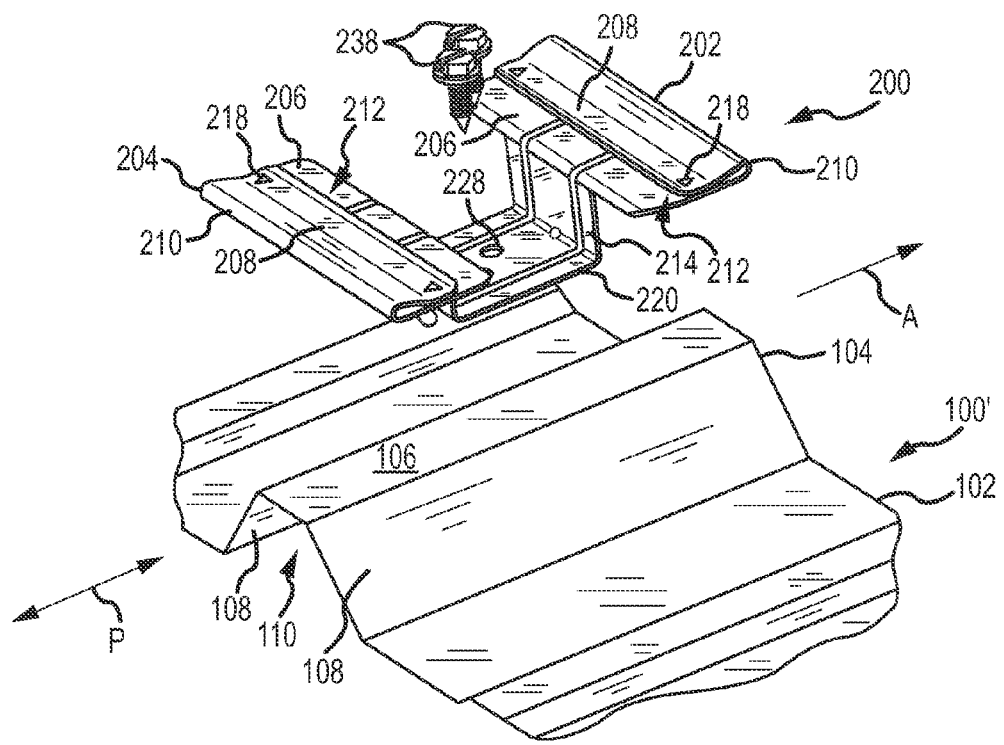
FIG. 2B is an exploded, perspective view of the module bracket used by the photovoltaic assembly of FIG. 2A.
Figure 2C:
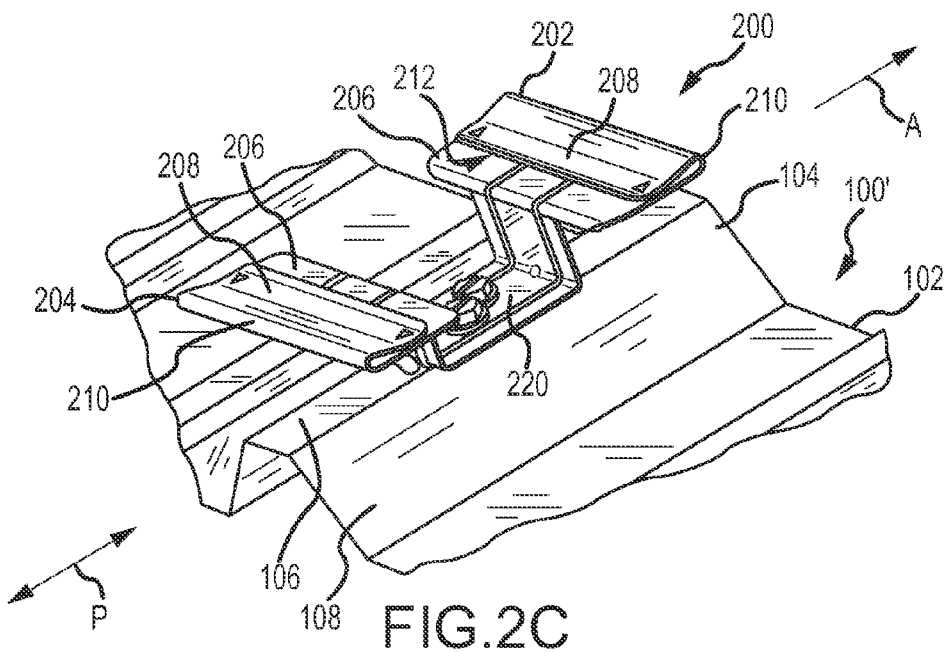
FIG. 2C is a perspective view of the module bracket, from the photovoltaic assembly of FIG. 2A, and as installed on a trapezoidal rib.
Figure 2D:
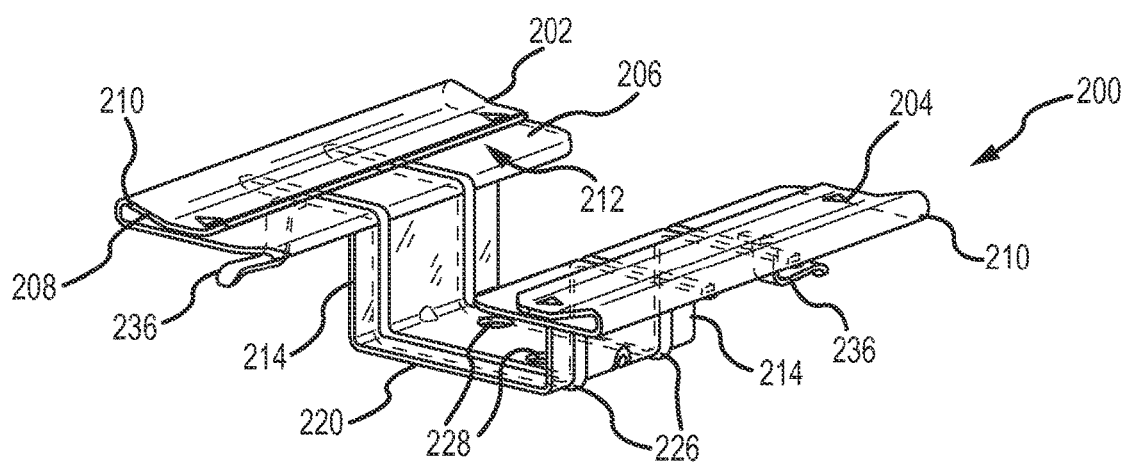
FIG. 2D is a perspective view of the module bracket used by the photovoltaic assembly of FIG. 2A.
Figure 2H:
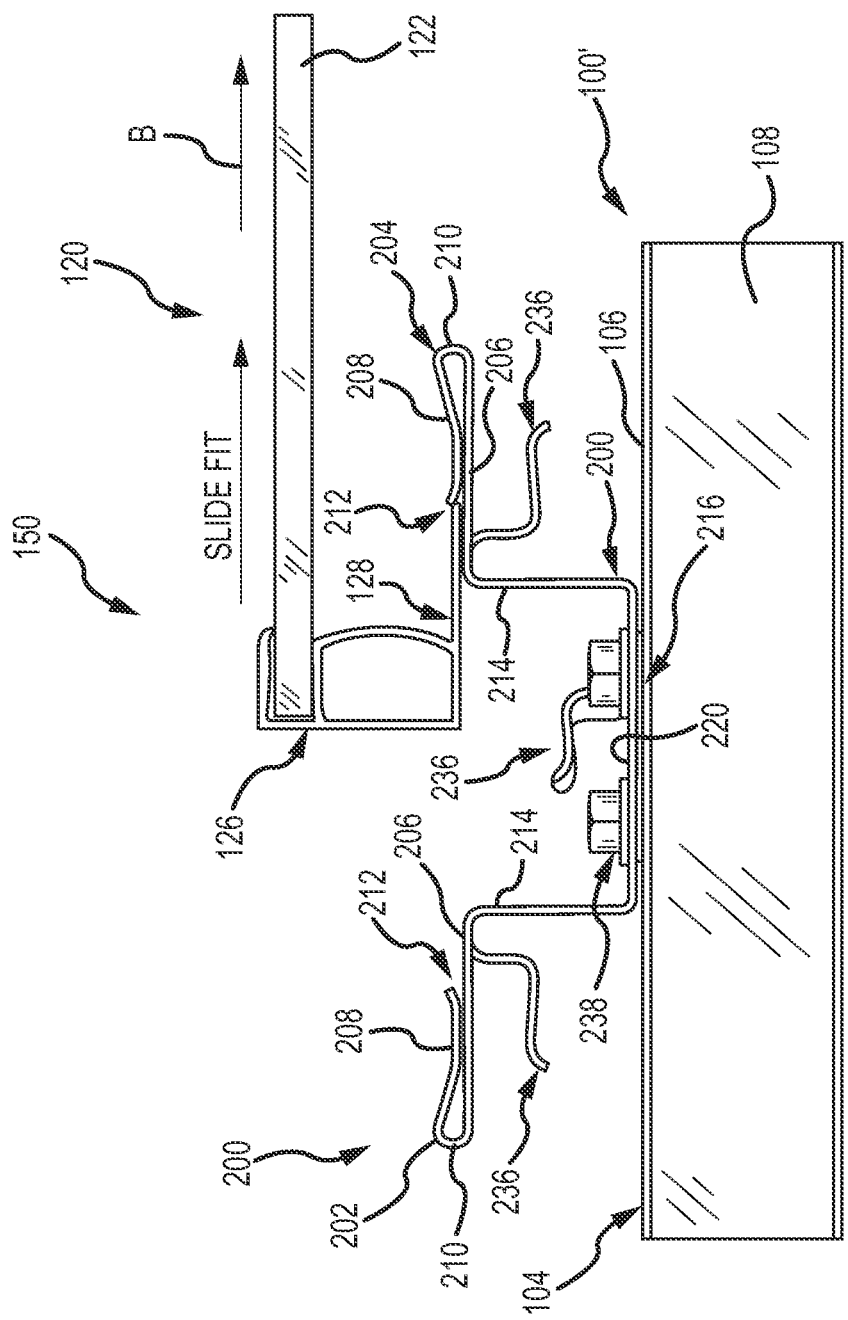
FIG. 2H is a side view of the module bracket and one of the photovoltaic modules from the photovoltaic assembly of FIG. 2A, with a module flange of the photovoltaic module being in position for installation on one of the mounting clips of the module bracket.
Figure 2I:
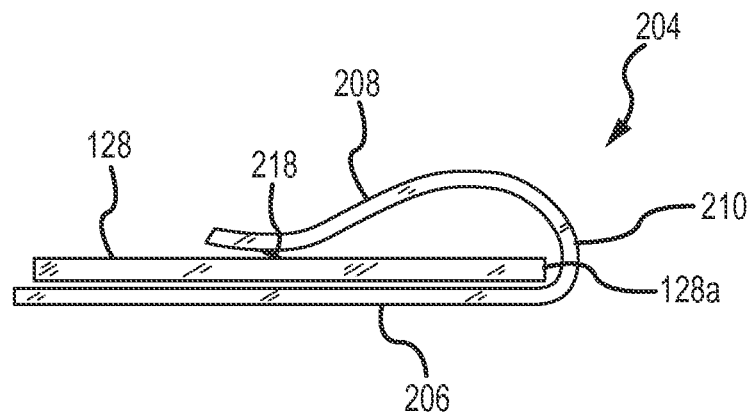
FIG. 2I is an enlarged, side view of one of the mounting clips used by the module bracket from the photovoltaic assembly of FIG. 2A, with one of the module flanges of one of the photovoltaic modules being installed therein.
Figure 2J:
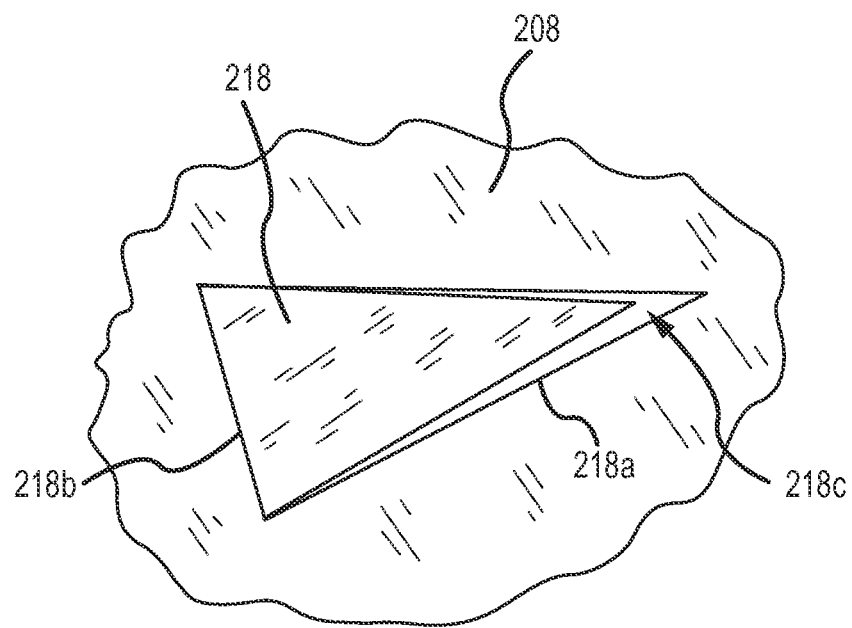
FIG. 2J is a perspective view of one of the projections/electrical contacts formed in the upper section of the mounting clips used by the module bracket from the photovoltaic assembly of FIG. 2A.

One of the electrical contacts or projections 218 is illustrated in FIGS. 2I and 2J. As each electrical contact 218 is preferably of the same configuration, only one will be described. The electrical contact 218 cantilevers from a remainder of the second section 208 of the corresponding mounting clip 202, 204 (e.g., each electrical contact 218 may be "punched" from the second section 208). That is, the electrical contact 218 is partially separated from its corresponding second section 208 to define an aperture 218a in the second section 208. The boundary between the electrical contact 218 and the remainder of the second section 208 (where the electrical contact 218 remains attached to its corresponding second section 208) is identified by reference numeral 218b in FIG. 2J. The electrical contact 218 may flex or bend relative to its corresponding second section 208 at least generally about this boundary 218b, and as such this may also be referred to as "hinge 218b."

In the illustrated embodiment, the electrical contact 218 is at least generally triangularly-shaped, and in any case extends downwardly toward its corresponding first section 206 at an angle. Other configurations may be appropriate. A free end section or point 218c of the electrical contact 218 may be characterized as being disposed in the direction of the closed end section 210 of the corresponding mounting clip 202, 204, while the hinge 218b may be characterized as being disposed in the direction of the inlet 212 to the corresponding mounting clip 202, 204. That is, the electrical contact 218 may be characterized as extending from its hinge 218b with the second section 208, at least generally in the direction of the closed end section 210 of the corresponding mounting clip 202, 204. The electrical contact 218 may also be characterized as extending from its hinge 218b with the second section 208, at least generally in the direction of its corresponding first section 206.

As noted, the first mounting clip 202 and the second mounting clip 204 are spaced along the pitch P of the roofing surface 100', with the first mounting clip 202 being disposed up-slope of its corresponding second mounting clip 204 (in the up-slope direction A). The mounting clips 202, 204 are oriented such that the inlet 212 of the first mounting clip 202 at least generally projects toward or faces in the direction of the second mounting clip 204, and such that the inlet 212 of the second mounting clip 204 at least generally projects toward or faces in the direction of the first mounting clip 202 (e.g., the inlet 212 to the first mounting clip 202 may project in the down-slope direction B; the inlet 212 to the second mounting clip 204 may project in the up-slope direction A). Stated another way, the mounting clips 202, 204 are oriented such that the end section 210 of the first mounting clip 202 is disposed up-slope of the inlet 212 of the first mounting clip 202, and such that the end section 210 of the second mounting clip 204 is disposed down-slope of the inlet 212 of the second mounting clip 204. Stated yet another way, the mounting clips 202, 204 are oriented such that the inlet 212 of the second mounting clip 204 is disposed up-slope of the end section 210 of the second mounting clip 204, such that the inlet 212 of the first mounting clip 202 is disposed up-slope of the inlet 212 of the second mounting clip 204, and such that the end section 210 of the first mounting clip 202 is disposed up-slope of the inlet 212 of the first mounting clip 202.

A base section 220 of the module bracket 200 is disposed between the first mounting clip 202 and the second mounting clip 204 along the pitch P of the roofing surface 100 when the module bracket 200 is installed thereon. The base section 220 may be characterized as being an at least generally flat or planar structure. The mounting clips 202, 204 of the module bracket 200 are offset from the base section 220. In this regard, one riser section 214 extends from base section 220 (e.g., one end thereof) to the first mounting clip 202. Another riser section 214 extends from the base section 220 (e.g., an opposite end thereof) to the second mounting clip 204. The riser sections 214 may be at least generally parallel to one another, and may be oriented at least generally perpendicularly to the base section 220. At least one wiring clip 236 may be disposed on the "underside" of the first mounting clip 202 (e.g., disposed within the space between the first mounting clip 202 and the rib 104 (e.g., its end section 106) on which the module bracket 200 is mounted). Similarly, at least one wiring clip 236 may be disposed on the "underside" of the second mounting clip 204 (e.g., disposed within the space between the second mounting clip 204 and the rib 104 (e.g., its end section 106) on which the module bracket 200 is mounted).

In the illustrated embodiment, the two riser sections 214 of the module bracket 200 are of a common height or length. As such, the first mounting clip 202 and the second mounting clip 204 of the module bracket 200 are disposed at a common elevation relative to the base section 220. When the module racket 200 is installed on the building surface 100', the first mounting clip 202 and the second mounting clip 204 may be characterized as being at least generally coplanar with each other in a dimension that is parallel with the pitch P of the roofing surface 100'. Moreover, the first mounting clip 202 and the second mounting clip 204 may be characterized as being disposed at a common, higher elevation than the base section 220, measured relative to a reference plane that contains the flat, base sections of the panel 102 (and from which the ribs 104 may extend).

The base section 220 of the module bracket 200 may be seated on the end section 106 of one of the ribs 104 of the roofing surface 100'. The surface of the base section 220 that that interfaces with or at least projects toward an end section 106, when the module bracket 200 is installed on the corresponding rib 104, may include a pair of stiffening beads or stiffeners 226. These stiffeners 226 may enhance the structural integrity of the module bracket 200, and may also extend along the riser sections 214 and the first sections 206 of the mounting clips 202, 204. The convex or protruding configuration/shape of the stiffeners 226 on the lower surface of the base section 220 may also function to reduce the potential for over-compressing a gasket 216 that may be positioned between the base section 220 and the end section 106 of the rib 104 on which the module bracket 200 is being installed.

One or more panel fasteners 238 may be used to secure the module bracket 200 to a rib 104 of the roofing surface 100'. In the illustrated embodiment, two panel fasteners 238 (e.g., threaded screws) extend through the base section 220 of the module bracket 200, through the end section 106 of the rib 104, and terminate within the hollow interior 110 of the rib 104. Any appropriate number of panel fasteners 238 may be used, and each may be of any appropriate type. The base section 220 of the module bracket 200 may include one or more fastener apertures 228, each of which may accommodate a single panel fastener 238.

Figure 2L:
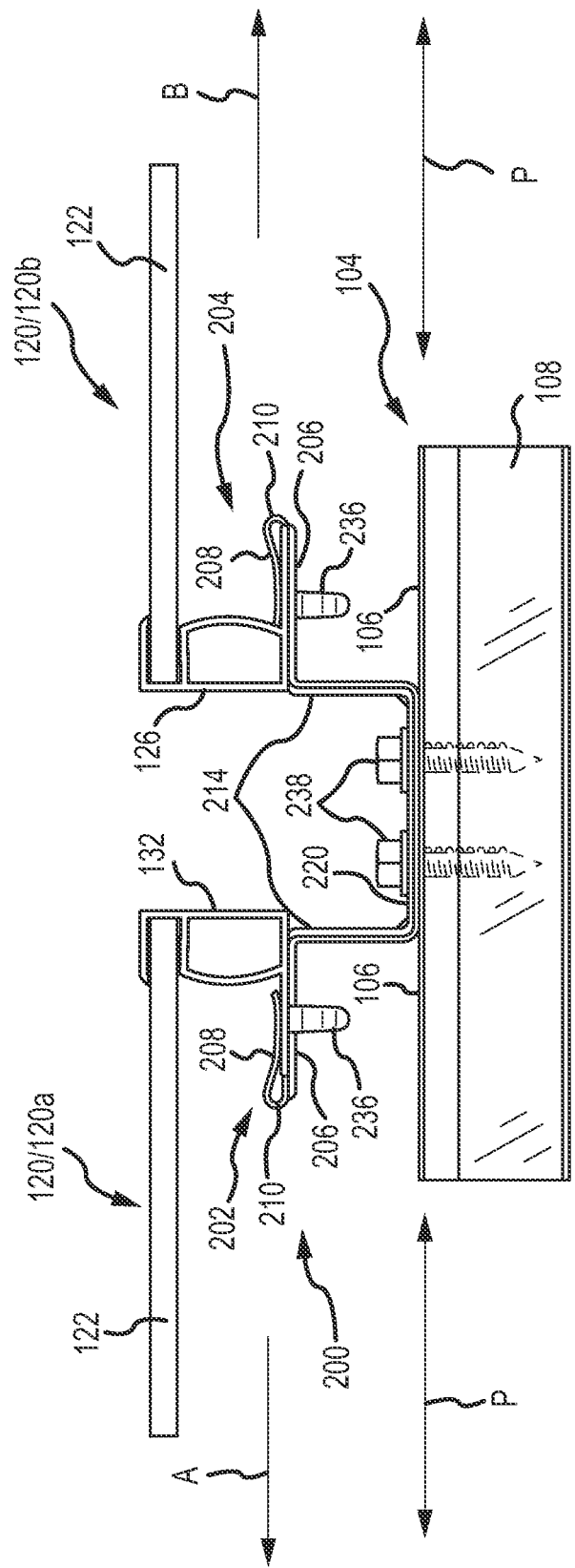
FIG. 2L is a side view of the photovoltaic assembly of FIG. 2A, with the module flanges of each photovoltaic module being engaged by its corresponding mounting clip of the module bracket.

Each module bracket 200 accommodates a maximum of two photovoltaic modules 120. Portions of two photovoltaic modules are illustrated in FIGS. 2A and 2L—one of the modules 120 is further identified by reference numeral 120a, and the other is further identified by reference numeral 120b. Each photovoltaic module 120 may be characterized as having a photovoltaic cell or body 122. A first frame section 126 may define the first perimeter section 124 of the corresponding photovoltaic module 120. A second frame section 132 may define the second perimeter section 130 of the corresponding photovoltaic module 120. The third perimeter section 136 (FIG. 1) of a photovoltaic module 120 could be defined by a frame section of any appropriate configuration (e.g., to protect the corresponding edge of the PV body 122), as could the fourth perimeter section 138 (FIG. 1) of a photovoltaic module 120. In any case, the first frame section 126 of the photovoltaic module 120 (e.g., an uphill end or edge of the photovoltaic module 120 when installed on the roofing surface 100') may include a first module flange 128 that cantilevers or extends at least generally in the direction of the second frame section 132 of the photovoltaic module 120 (e.g., a downhill end or edge of the photovoltaic module 120 when installed on the roofing surface 100'). Similarly, the second frame section 132 of the photovoltaic module 120 (e.g., a downhill end or edge of the photovoltaic module 120 when installed on the roofing surface 100') may include a second module flange 134 that cantilevers or extends at least generally in the direction of the first frame section 126 of the photovoltaic module 120 (e.g., an uphill end or edge of the photovoltaic module 120 when installed on the roofing surface 100'). The first module flange 128 may be characterized as extending at least generally in the direction of the second module flange 134, and vice versa. The first module flange 128 may be characterized as extending in the down-slope direction B when the photovoltaic module 120 is installed on the roofing surface 100' (and terminates at free end 128a that is spaced from a free end 134a of the second module flange 134 for this same module 120). Similarly, the second module flange 134 may be characterized as extending in the up-slope direction A when the photovoltaic module 120 is installed on the roofing surface 100' (and terminates at a free end 134a that is spaced from a free end 128a of the first module flange 128 for this same module 120).

The module bracket 200 provides what may be characterized as a "slide fit" for each photovoltaic module 120 installed thereon. An embodiment of an installation method that utilizes this "slide fit" connection will be discussed in more detail below. Generally, the second module flange 134 of the photovoltaic module 120a may be slid relative to the first mounting clip 202. This will initially direct the free end 134a of the second module flange 134 of the photovoltaic module 120a into the inlet 212 of the first mounting clip 202. Further relative movement between the photovoltaic module 120a and the first mounting clip 202 may move its second section 208 at least generally away from its first section 206 (e.g., by a flexing of the end section 210 of the first mounting clip 202; by the second section 208 at least generally moving or pivoting away from its corresponding first section 206). Eventually, the free end 134a of the second module flange 134 may come into contact the end section 210 of the first mounting clip 202 to "positionally register" the photovoltaic module 120a relative to the module bracket 200. In any case and as discussed above, an electrical path may be provided between the module bracket 200 and the photovoltaic module 120a by the second module flange 134 of the module 120a being sandwiched between the second section 208 and the corresponding first section 206 of the first mounting clip 202, where the projections 218 on the second section 208 may facilitate the establishment of electrical contact with the second module flange 134 of the module 120a.

The photovoltaic module 120b may be installed on the second mounting clip 206 in the same general manner as the photovoltaic module 120a. Generally, the first module flange 128 of the photovoltaic module 120b may be slid relative to the second mounting clip 204. This will initially direct the free end 128a of the first module flange 128 of the photovoltaic module 120b into the inlet 212 of the second mounting clip 204. Further relative movement between the photovoltaic module 120b and the second mounting clip 204 will then move its second section 208 at least generally away from its first section 206 (e.g., by a flexing of the end section 210 of the second mounting clip 204; by the second section 208 at least generally moving or pivoting away from its corresponding first section 206). Eventually, the free end 128a of the first module flange 128 may come into contact the end section 210 of the second mounting clip 204 to "positionally register" the photovoltaic module 120b relative to the module bracket 200. In any case and as discussed above, an electrical path may be provided between the module bracket 200 and the photovoltaic module 120b by the first module flange 128 of the module 120b being sandwiched between the second section 208 and the corresponding first section 206 of the second mounting clip 204, where the projections 218 on the second section 208 may facilitate the establishment of electrical contact with the first module flange 128 of the module 120b.

A number of observations may be made with regard to the module bracket 200 in relation to installing photovoltaic modules on the roofing surface 100' (and that are equally applicable to the module brackets 200$^i$, 200$^{iii}$, 200$^v$, and 200$^{vi}$ discussed below). One is that contact between the module bracket 200 and the photovoltaic modules 120a, 120b is limited to the mounting clips 202, 204—no other portion of the module bracket 200 contacts either the photovoltaic module 120a or the photovoltaic module 120b. Another is that the entirety of the retention forces exerted by the module bracket 200 on the photovoltaic modules 120a, 120b is provided by the mounting clips 202, 204 (no other forces are used to retain the modules 120a, 120b on the module bracket 200). The mounting clip 202 may exert a compressive force on the second module flange 134 of the photovoltaic module 120a. Similarly, the mounting clip 204 may exert a compressive force on the first module flange 128 of the photovoltaic module 120b.

The riser sections 214 of the module bracket 200 provide a vertical offset between the base section 220 and each of the mounting clips 202, 204, as noted. This increases the spacing between the photovoltaic modules 120a, 120b and the underlying roofing surface 100'. One advantage of this increased spacing between the photovoltaic modules 120a, 120b and the underlying roofing surface 100' is an enhanced cooling of the photovoltaic modules 120a, 120b, which may increase their operational efficiency (e.g., by accommodating an increased airflow between the roofing surface 100' and the underside of the photovoltaic modules 120a, 120b). Another advantage of this increased spacing between the photovoltaic modules 120a, 120b and the underlying roofing surface 100' is enhanced access to the underside of the photovoltaic modules 120a, 120b (e.g., for wire management; providing more room for installers/service technicians to install/access/move/remove wires on the underside of the photovoltaic modules 120a, 120b). The vertical offset between the base section 220 and each of the mounting clips 202, 204 is at least about 0.5" in one embodiment, and is at least about 0.75" in another embodiment (e.g., measured orthogonally to the pitch P of the roofing surface 100' when the module bracket 200 is installed on the roofing surface 100').

The module bracket 200 itself provides an electrical connection between the photovoltaic module 120a and the photovoltaic module 120b—the module bracket 200 provides an electrical path between the modules 120a and 120b. At least one electrical contact 218 is incorporated by each of the mounting clips 202, 204. In the illustrated embodiment, each electrical contact 218 is incorporated by the second section 208 on each of the mounting clips 202, 204. As the second module flange 134 of the photovoltaic module 120a is slid into the mounting clip 202, at least one (and preferably multiple) electrical contacts 218 should engage the second module flange 134. The free end section 218c of each such electrical contact 218 may scratch the surface of the second module flange 134 of the photovoltaic module 120*a* to enhance the electrical connectivity between the mounting clip 202 and the photovoltaic module 120*a*. Similarly, as the first module flange 128 of the photovoltaic module 120*b* is slid into the mounting clip 204, at least one (and preferably multiple) electrical contacts 218 should engage the first module flange 128. The free end section 218*c* of each such electrical contact 218 may scratch the surface of the first module flange 128 of the photovoltaic module 120*b* to enhance the electrical connectivity between the mounting clip 204 and the photovoltaic module 120*b*.

Based upon the described orientation of the electrical contacts 218 on each of the mounting clips 202, 204, sliding the module flanges 134, 128 into the mounting clips 202, 204, respectively, may cause one or more of the electrical contacts 218 to move relative to the remainder of its corresponding second section 208 (of the corresponding mounting clip 202, 204)—the free end section 218*c* of one or more electrical contacts 218 may move at least generally away from the corresponding module flange 128, 134 (and at least generally about its corresponding hinge 218*b*). However, the free end section 218*c* of each electrical contact 218 should remain in contact with the corresponding module flange 128, 134. In one embodiment, contact between the second section 208 of each mounting clip 202, 204 and the corresponding module flange 128, 134 may be limited to one or more electrical contacts 218 (e.g., it may be that the only portion of a given second section 208 to contact a given module flange 128, 134 is one or more of its electrical contacts 218).

The described orientation of each electrical contact 218 may also provide resistance to sliding the photovoltaic modules 120*a*, 120*b* out of the mounting clips 202, 204, respectively. Sliding the photovoltaic module 120*a* relative to the mounting clip 202 in a direction to withdraw the second module flange 134 out through the inlet 212 of the mounting clip 202 may cause one or more electrical contacts 218 to move relative to the remainder of its corresponding second section 208 of the mounting clip 202—the free end section 218*c* of one or more electrical contacts 218 may move at least generally toward the second module flange 134 of the photovoltaic module 120*a* (and at least generally about its corresponding hinge 218*b* in a direction that is opposite of the direction that such a free end section 218*c* may move during installation; a "wedging action" for one or more electrical contacts 218). Similarly, sliding the photovoltaic module 120*b* relative to the mounting clip 204 in a direction to withdraw the first module flange 128 out through the inlet 212 of the mounting clip 204 may cause one or more electrical contacts 218 to move relative to the remainder of its corresponding second section 208 of the mounting clip 204—the free end section 218*c* of one or more electrical contacts 218 may move at least generally toward the first module flange 128 of the photovoltaic module 120*b* (and at least generally about its corresponding hinge 218*b* in a direction that is opposite of the direction that such a free end section 218*c* may move during installation; a "wedging action" for one or more electrical contacts 218).

Figure 3:
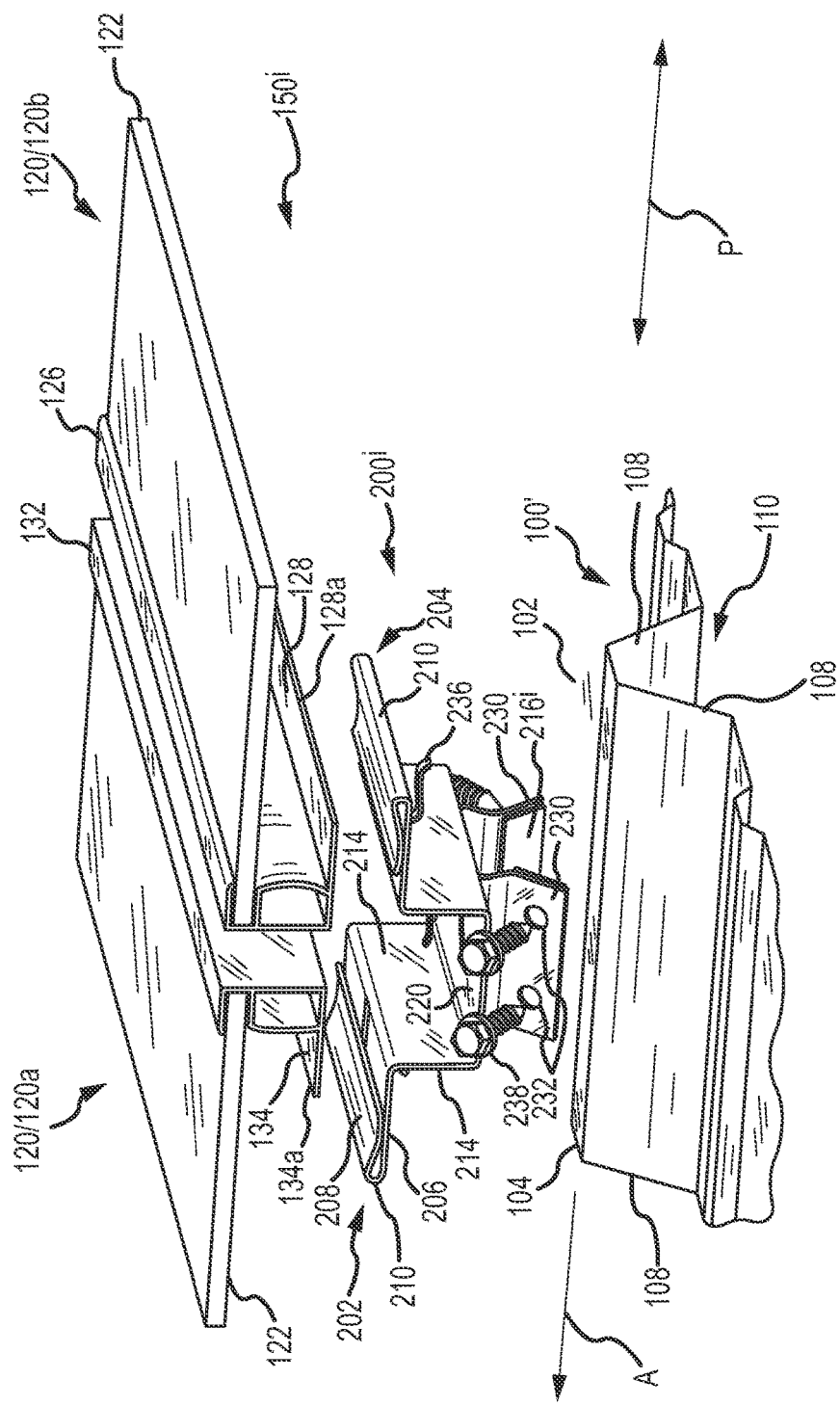
FIG. 3 is an exploded, perspective view of one embodiment of a photovoltaic assembly installed on a roofing surface defined by trapezoidal rib panels, where the photovoltaic assembly uses another embodiment of a module bracket.
Figure 4A:
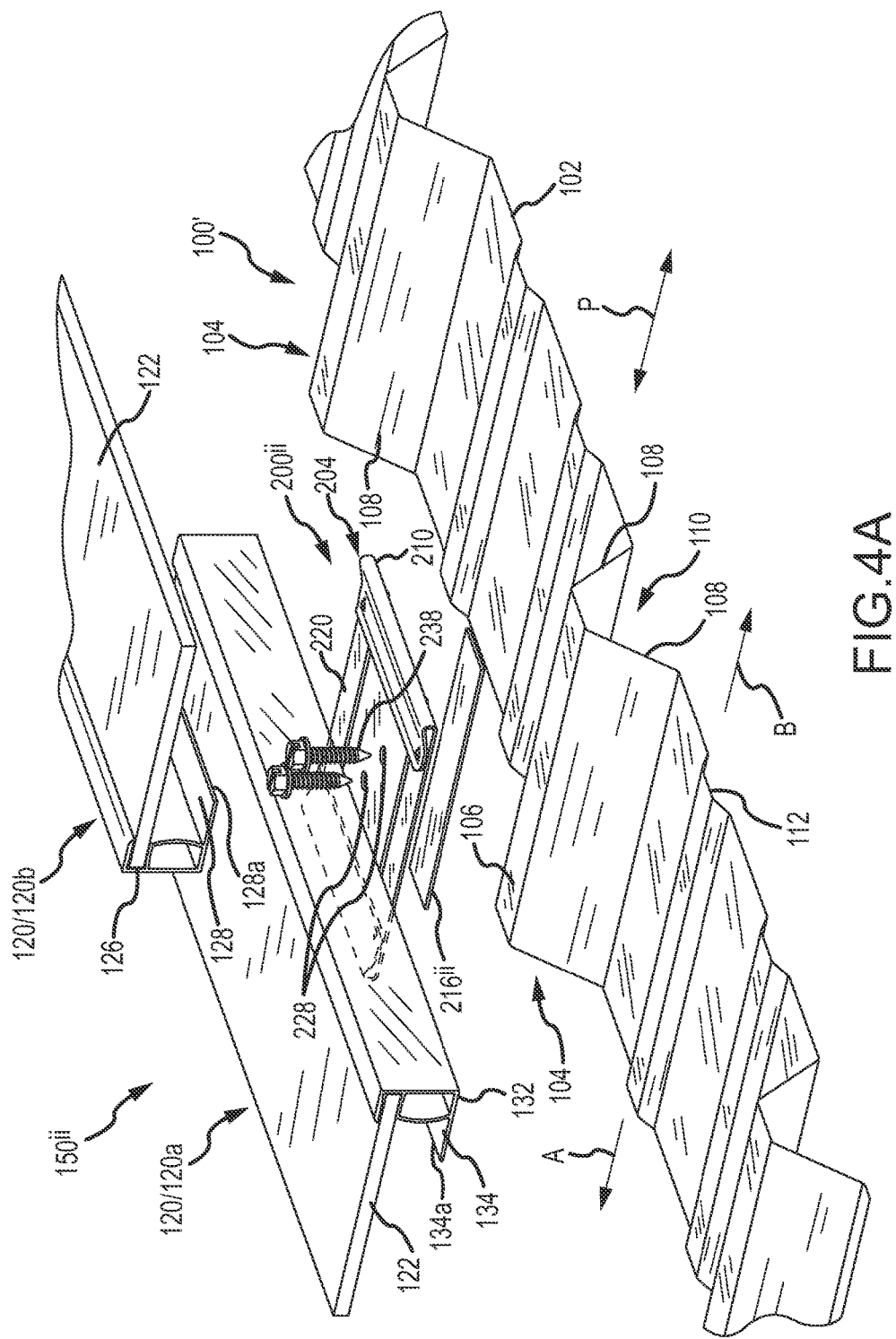
FIG. 4A is an exploded, perspective view of one embodiment of a photovoltaic assembly installed on a roofing surface defined by trapezoidal rib panels, where the photovoltaic assembly uses another embodiment of a module bracket.
Figure 4B:
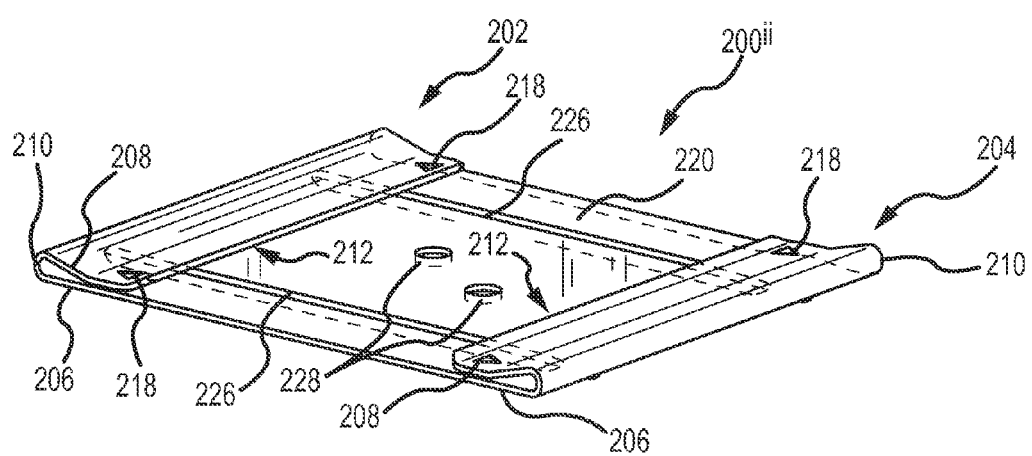
FIG. 4B is a perspective view of the module bracket used by the photovoltaic assembly of FIG. 4A.
Figure 4F:
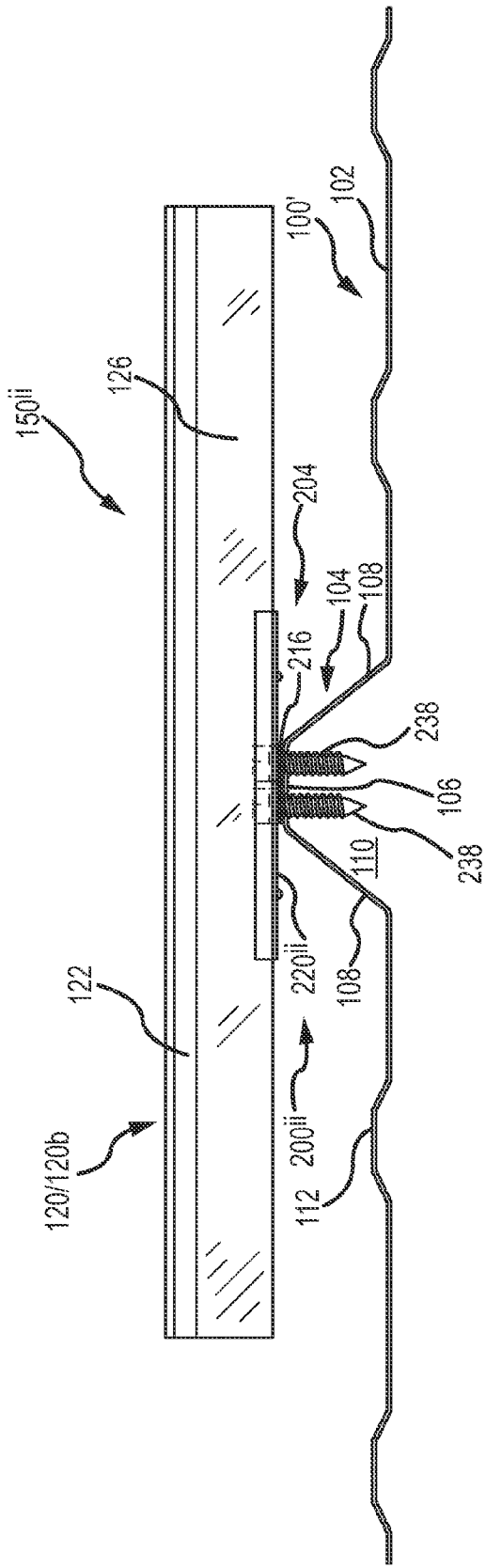
FIG. 4F is a cutaway view of the photovoltaic assembly of FIG. 4A, taken transversely to the pitch of the roofing surface, and looking in the up-slope direction.
Figure 4G:
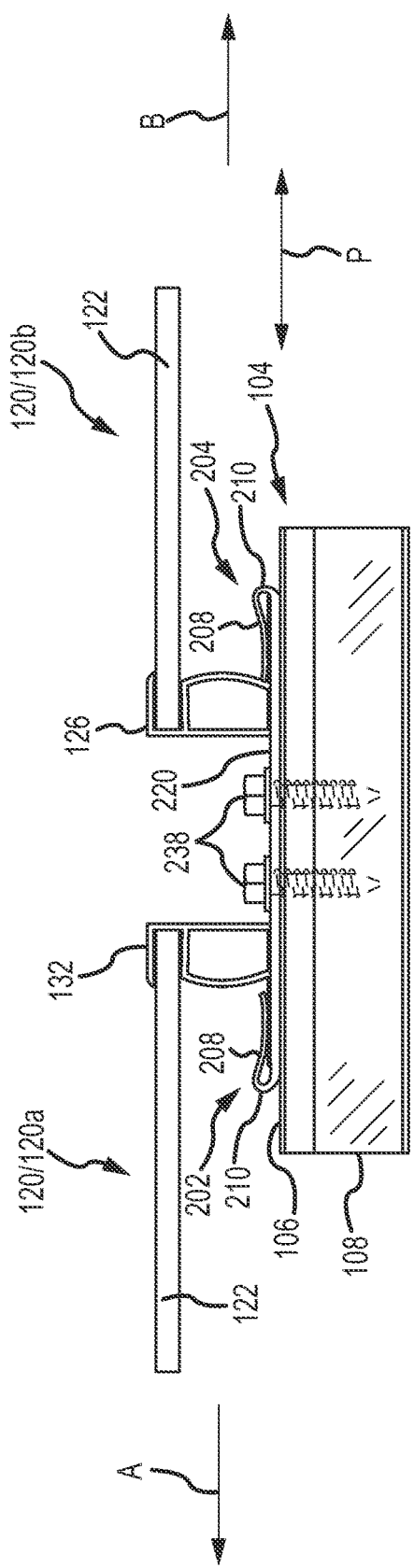
FIG. 4G is a side view of the photovoltaic assembly of FIG. 4A, with the module flanges of each photovoltaic module being engaged by its corresponding mounting clip of the module bracket.

FIG. 3 present another embodiment of a photovoltaic assembly 150$^i$ that utilizes a variation of the module bracket 200 discussed above in relation to FIGS. 2A-L. Those portions of the module bracket 200$^i$ of FIG. 3 that differ from the module bracket 200 of FIGS. 2A-L are identified by a superscripted "i". Unless otherwise noted, the discussion presented above with regard to the module bracket 200 is applicable to the module bracket 200$^i$.

The module bracket 200$^i$ of FIG. 3 attaches to the rib 104 of the roofing surface 100' in a different manner than the module bracket 200 of FIGS. 2A-L. The module bracket 200$^i$ utilizes a pair of bracket flanges 230 that extend from opposite sides of the base section 220$^i$ of the module bracket 200$^i$. One of the bracket flanges 230 may be positioned alongside at least an upper portion of one of the sidewalls 108 of the rib 104 on which the module bracket 200$^i$ is being installed, while the other of the bracket flanges 230 may be positioned alongside at least an upper portion of the other of the sidewalls 108 of this same rib 104. A gasket 216$^i$ may be positioned between one of the bracket flanges 230 and its corresponding sidewall 108 of the rib 104, while another gasket 216$^i$ may be positioned between the other of the bracket flanges 230 and its corresponding sidewall 108 of the rib 104. Each bracket flange 230 may include one or more fastener apertures 232 (two in the illustrated embodiment). At least one panel fastener 238 (two in the illustrated embodiment) may be directed through one of the bracket flanges 230 (e.g., through a corresponding fastener aperture 232), through any corresponding gasket 216$^i$, through a corresponding portion of the sidewall 108 of the rib 104, and may terminate within the hollow interior 110 of the rib 104. At least one panel fastener 238 (two in the illustrated embodiment) may be directed through the other of the bracket flanges 230 (e.g., through a corresponding fastener aperture 232), through any corresponding gasket 216$^i$, through a corresponding portion of the sidewall 108 of the rib 104, and may terminate within the hollow interior 110 of the rib 104. As such, the base section 220$^i$ of the module bracket 200$^i$ need not include any fastener apertures 232 for the FIG. 3 embodiment. The base section 200$^i$ could also thereby incorporate one or more wiring clips 236.

The module bracket 200$^i$ could be fabricated in any appropriate manner. The mounting clips 202, 204, the riser sections 214, and the base section 220$^i$ could be of a one-piece construction (e.g., integrally formed from a piece of sheet metal). Each of the bracket flanges 230 could be separately formed and separately attached to the opposing sides of the base section 220$^i$ in any appropriate manner. Although not shown, the module bracket 200$^i$ could utilize the stiffeners 226 discussed above in relation to the module bracket 200.

FIGS. 4A-G present another embodiment of a photovoltaic assembly 150$^{ii}$ that utilizes a variation of the module bracket 200 discussed above in relation to FIGS. 2A-L. Those portions of the module bracket 200$^{ii}$ of FIGS. 4A-G that differ from the module bracket 200 of FIGS. 2A-L are identified by a superscripted "ii". Unless otherwise noted, the discussion presented above with regard to the module bracket 200 is applicable to the module bracket 200$^{ii}$.

The module bracket 200$^{ii}$ of FIGS. 4A-G eliminates the two riser sections 214 used by the module bracket 200 of FIGS. 2A-L. As such, the base section 220 of the module bracket 200$^{ii}$ is at least generally coplanar with the first section 206 of each of the mounting clips 202, 204. The gasket 216$^{ii}$ may be of an extended length so as to be disposed between the upper section 106 of the rib 104 and each of the first mounting clip 202, the base section 220, and the second mounting clip 204. In one variation of the module bracket 200$^{ii}$ (not shown), a pair of bracket flanges 230 could extend from the opposite sides of the base section 220, and could be used to attach the module bracket 200$^{ii}$ to the rib 104 of the roofing surface 100' in the manner of the FIG. 3 embodiment addressed above. In another variation of the module bracket 200$^{ii}$ (not shown), a pair of bracket flanges 230 could extend from the opposite sides of the base section 220, but the module bracket $200^{iii}$ could still be attached to the rib 104 of the roofing surface 100' in the manner illustrated in FIGS. 4A-G (e.g., not using any panel fasteners 238 in conjunction with the bracket flanges 230).

A number of observations may be made with regard to the module bracket $200^{ii}$ in relation to installing photovoltaic modules on the roofing surface 100'. As the mounting clips 202, 204 are not offset from the base section 220 in the case of the module bracket $200^{ii}$, the module bracket $200^{ii}$ does not provide the spacing that is provided by the embodiment of FIGS. 2A-L and the associated benefits. However, the entirety of the retention forces exerted by the module bracket $200^{ii}$ on the photovoltaic modules 120a, 120b continues to be provided by the mounting clips 202, 204 (no other forces are used to retain the modules 120a, 120b on the module bracket $200^{ii}$). Moreover, the mounting clip 202 may exert a compressive force on the second module flange 134 of the photovoltaic module 120a. Similarly, the mounting clip 204 may exert a compressive force on the first module flange 128 of the photovoltaic module 120b. As the module bracket $200^{ii}$ also includes at least one least one electrical contact 218 for each of the mounting clips 202, 204, the corresponding discussion presented above with regard to the embodiment of FIGS. 2A-L is equally applicable to the embodiment of FIGS. 4A-G.

Figure 5:
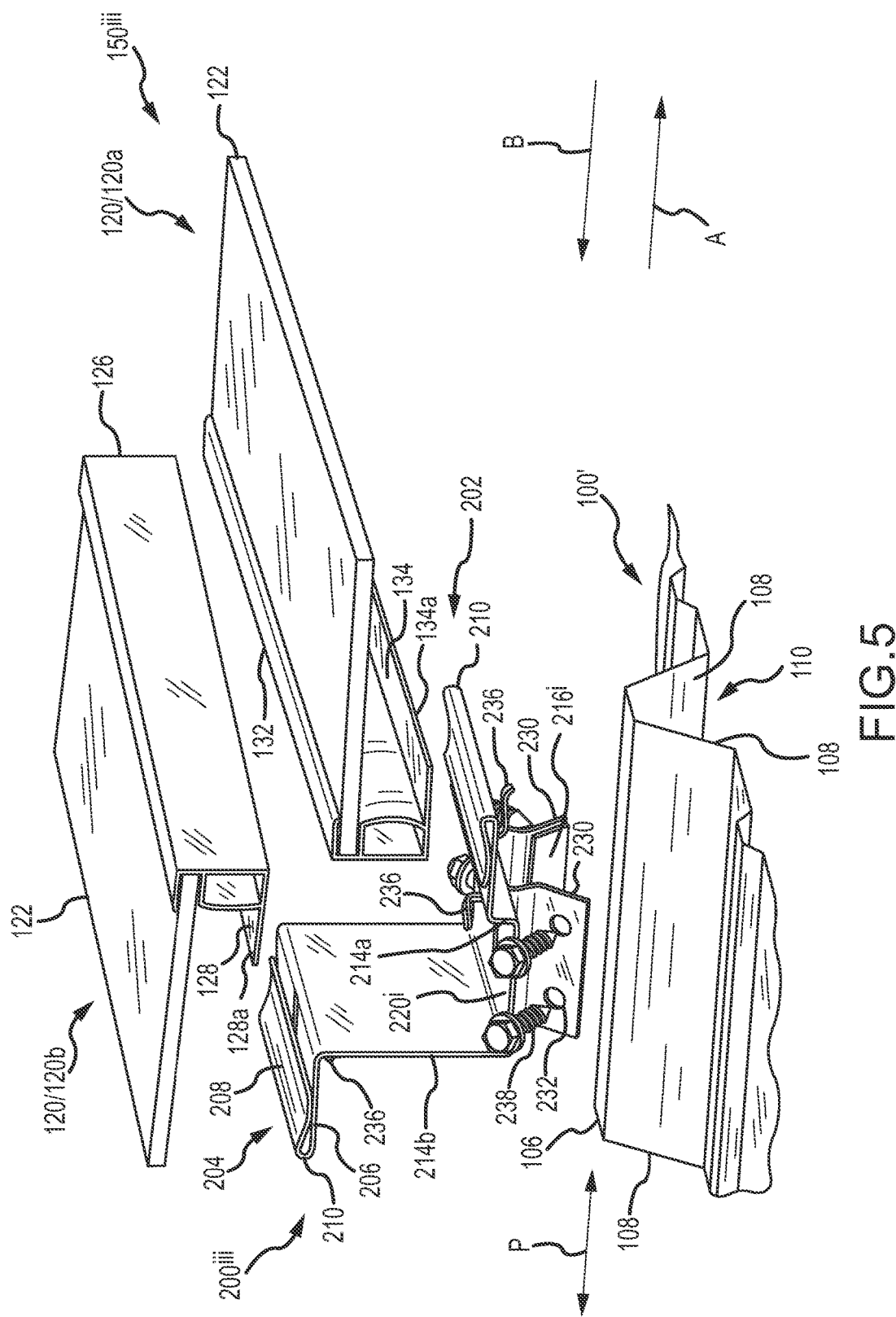
FIG. 5 is an exploded, perspective view of one embodiment of a photovoltaic assembly installed on a roofing surface defined by trapezoidal rib panels, where the photovoltaic assembly uses another embodiment of a module bracket that accommodates tilting of the photovoltaic modules relative to the roofing surface.
Figure 6A:
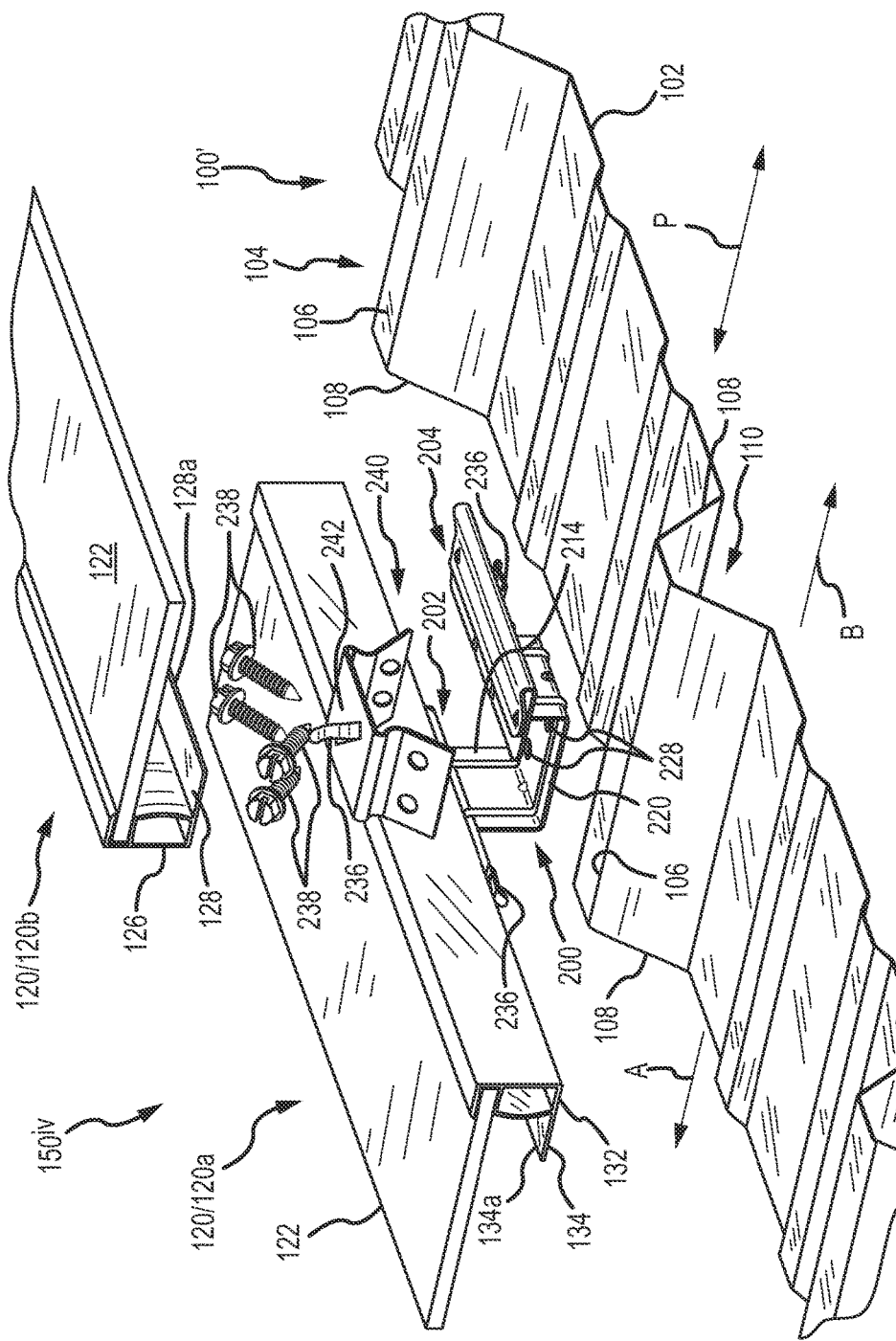
FIG. 6A is an exploded, perspective view of one embodiment of a photovoltaic assembly installed on a roofing surface defined by trapezoidal rib panels, where the photovoltaic assembly uses a separate module bracket and a separate panel bracket for interconnecting a pair of adjacent photovoltaic modules with the roofing surface.
Figure 6C:
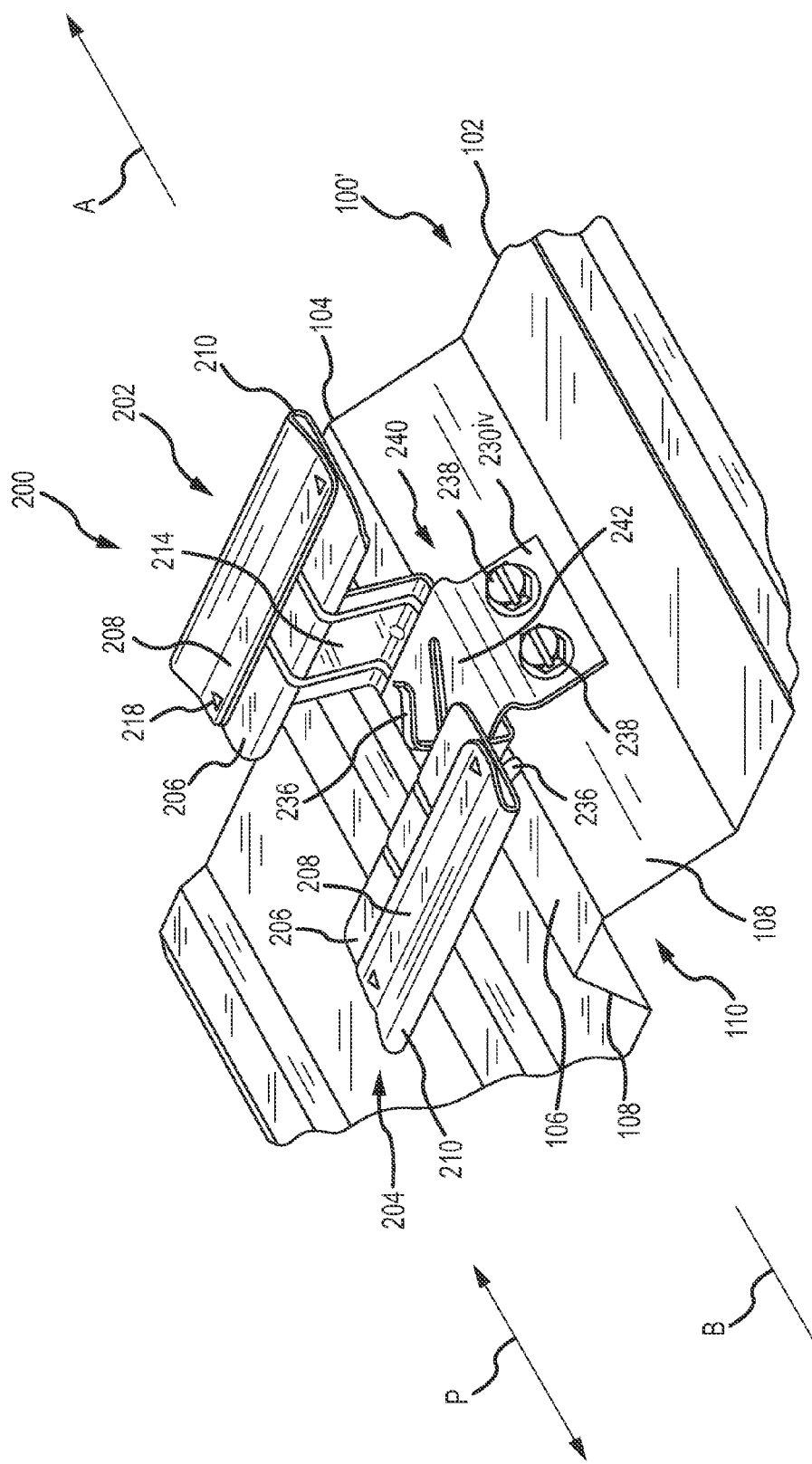
FIG. 6C is a perspective view of the separate module bracket and panel bracket, from the photovoltaic assembly of FIG. 6A, and as installed on a trapezoidal rib.
Figure 6D:
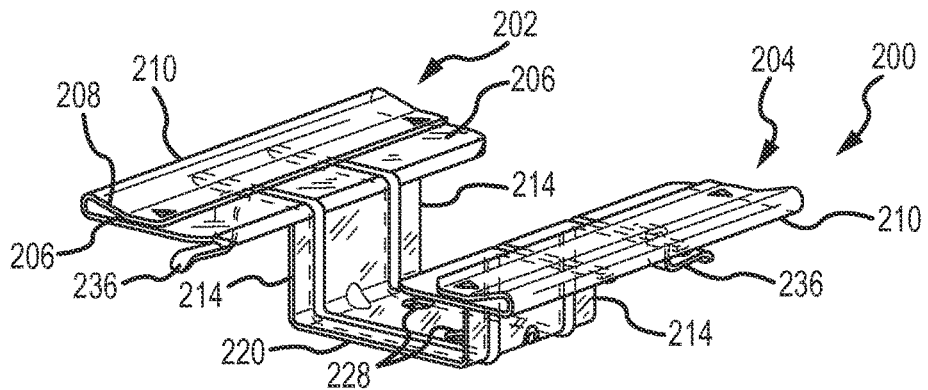
FIG. 6D is a perspective view of the module bracket used by the photovoltaic assembly of FIG. 6A.
Figure 6E:
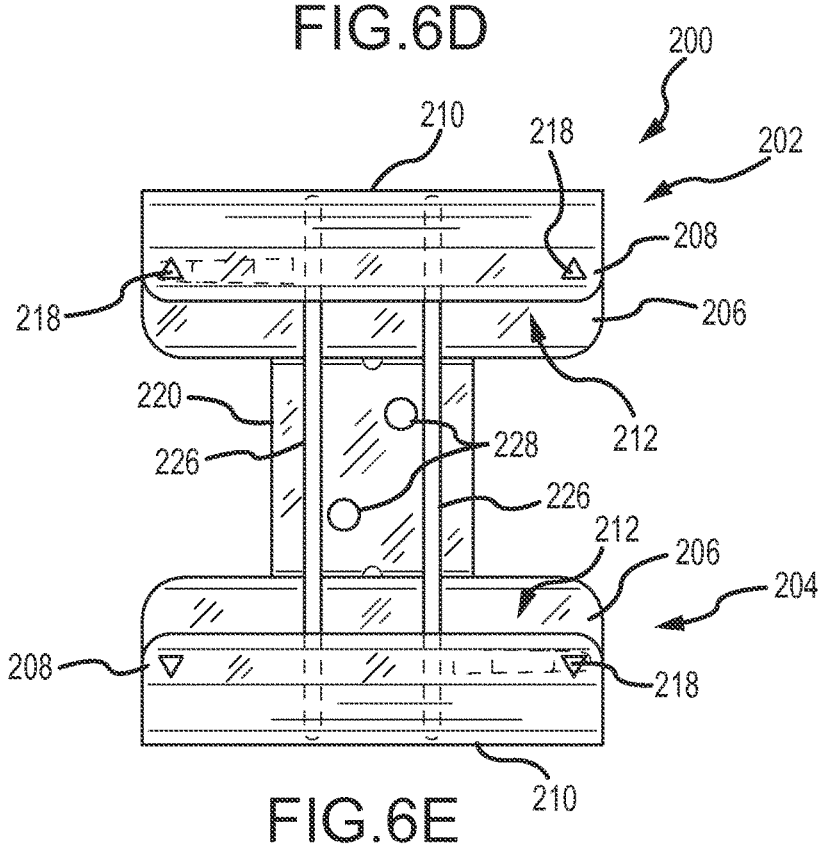
FIG. 6E is a top view of the module bracket used by the photovoltaic assembly of FIG. 6A.
Figure 6F:
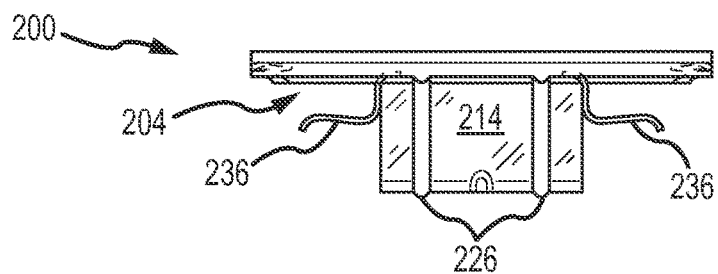
FIG. 6F is an end view of the module bracket used by the photovoltaic assembly of FIG. 6A, looking in the up-slope direction.
Figure 6G:
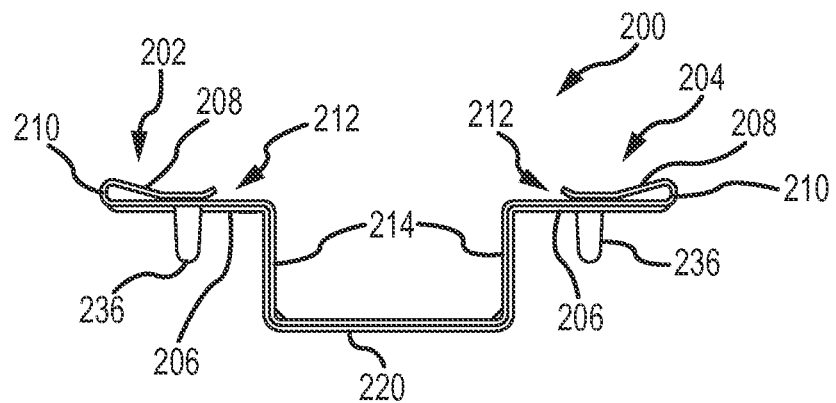
FIG. 6G is a side view of the module bracket used by the photovoltaic assembly of FIG. 6A.
Figure 6H:
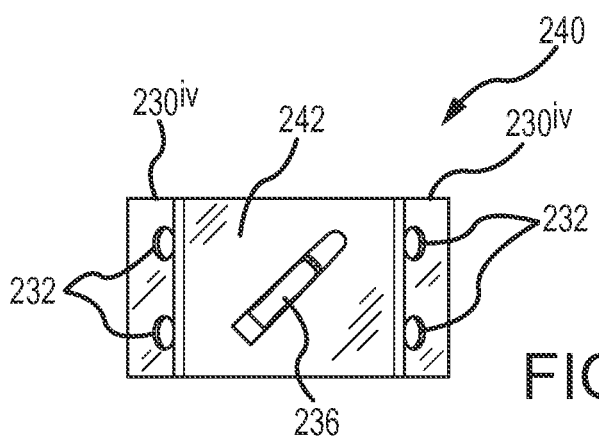
FIG. 6H is a top view of the panel bracket used by the photovoltaic assembly of FIG. 6A.
Figure 6I:
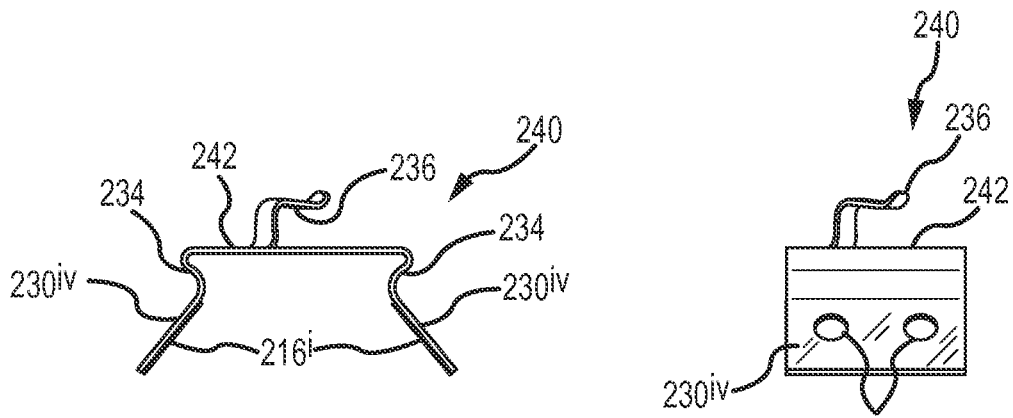
FIG. 6I is an end view of the panel bracket used by the photovoltaic assembly of FIG. 6A.
Figure 6J:
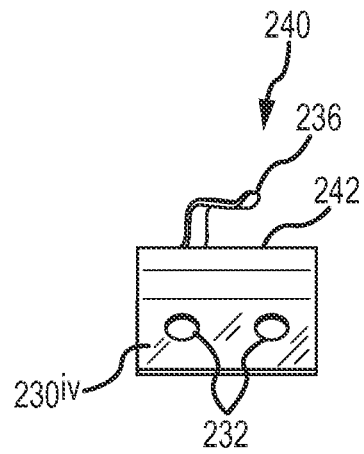
FIG. 6J is a side view of the panel bracket used by the photovoltaic assembly of FIG. 6A.
Figure 7A:
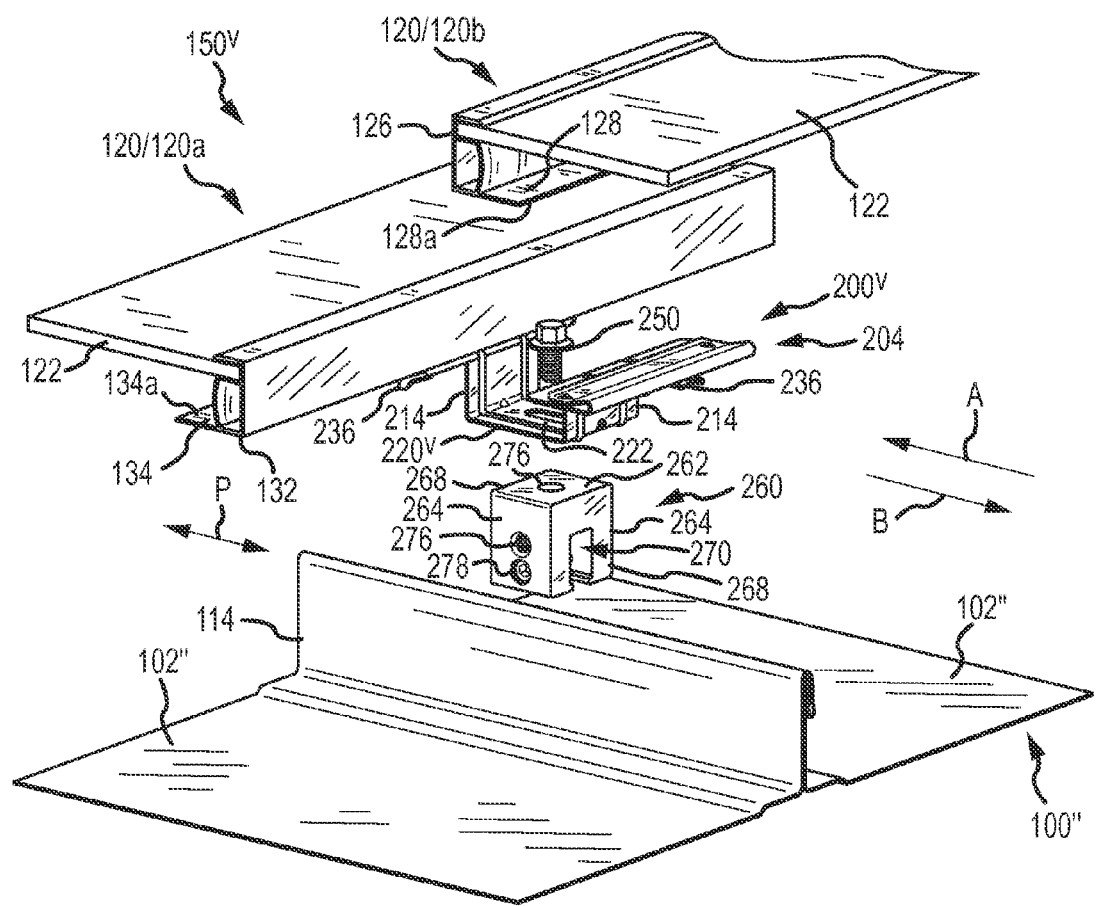
FIG. 7A is an exploded, perspective view of one embodiment of a photovoltaic assembly installed on a standing seam roofing surface, where the photovoltaic assembly uses an adaptation of the module bracket from the photovoltaic assembly of FIGS. 2A-L.
Figure 7B:
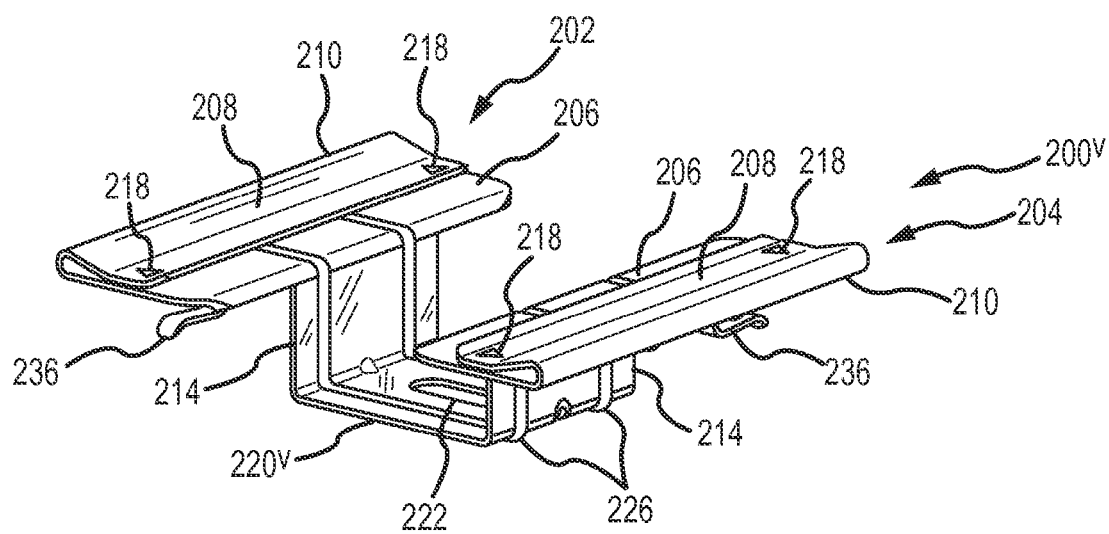
FIG. 7B is a perspective view of the module bracket used by the photovoltaic assembly of FIG. 7A.
Figure 7F:
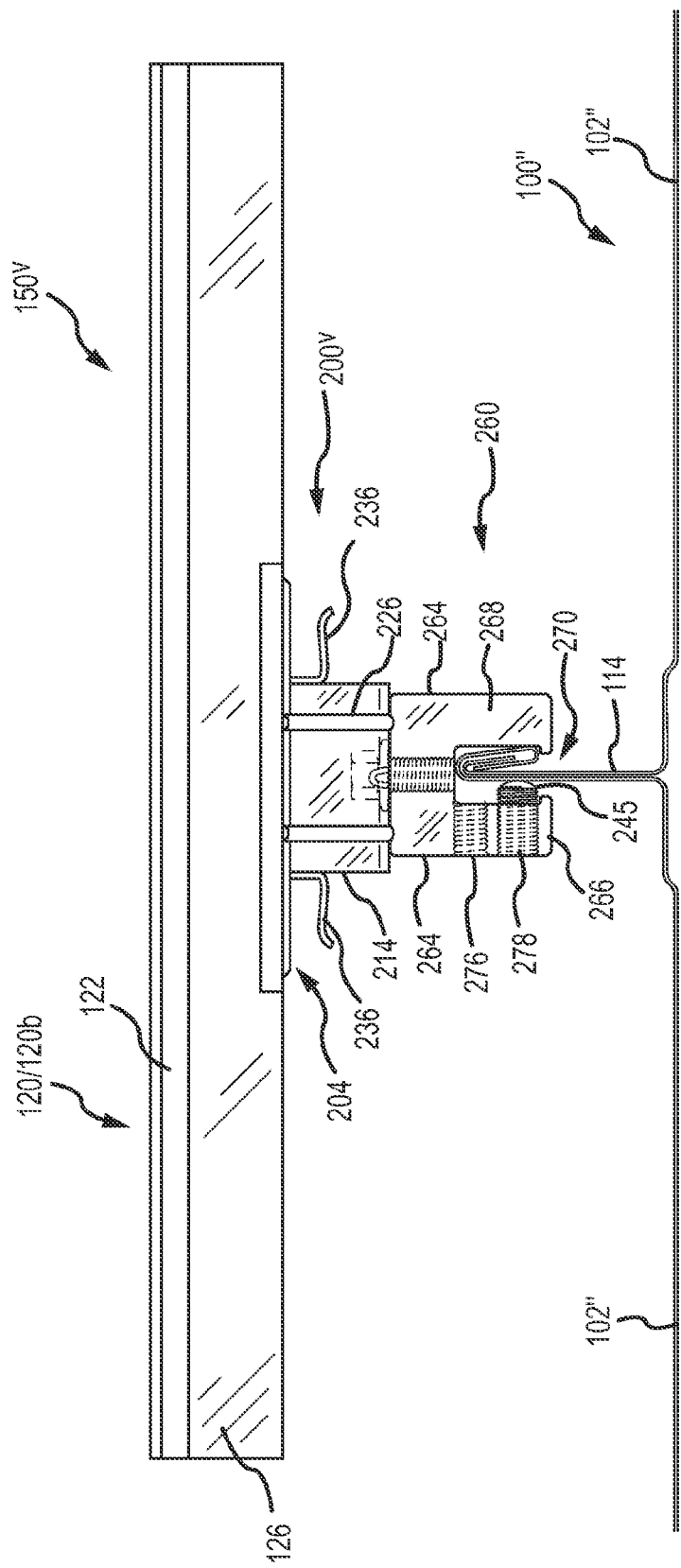
FIG. 7F is a cutaway view of the photovoltaic assembly of FIG. 7A, taken transversely to the pitch of the roofing surface, and looking in the up-slope direction.
Figure 8B:
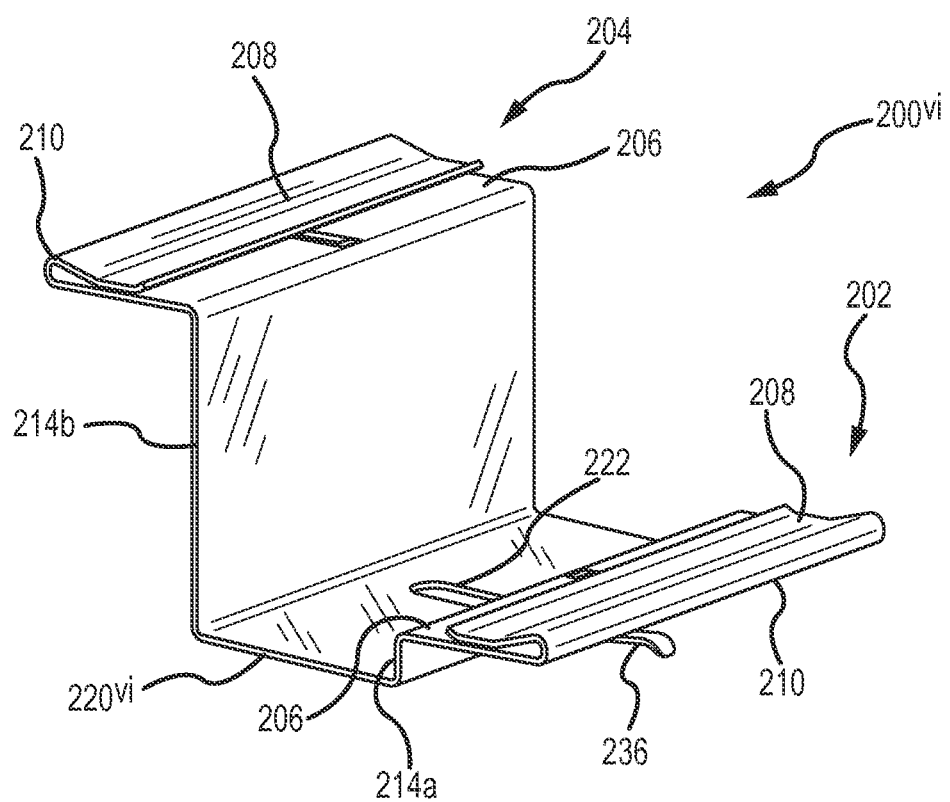
FIG. 8B is a perspective view of the module bracket used by the photovoltaic assembly of FIG. 8A.
Figure 8F:
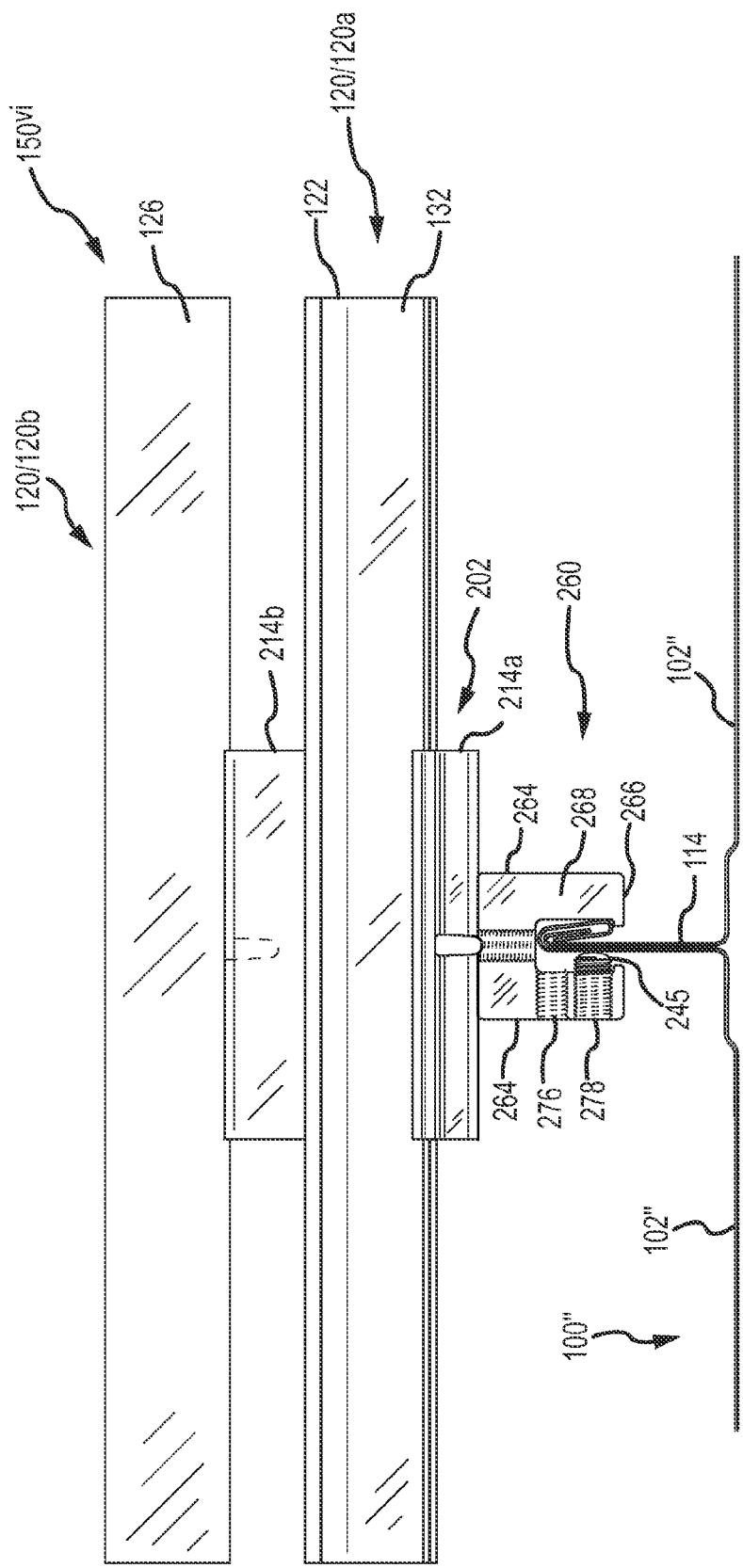
FIG. 8F is a cutaway view of the photovoltaic assembly of FIG. 8A, taken transversely to the pitch of the roofing surface, and looking in the down-slope direction.
Figure 8G:
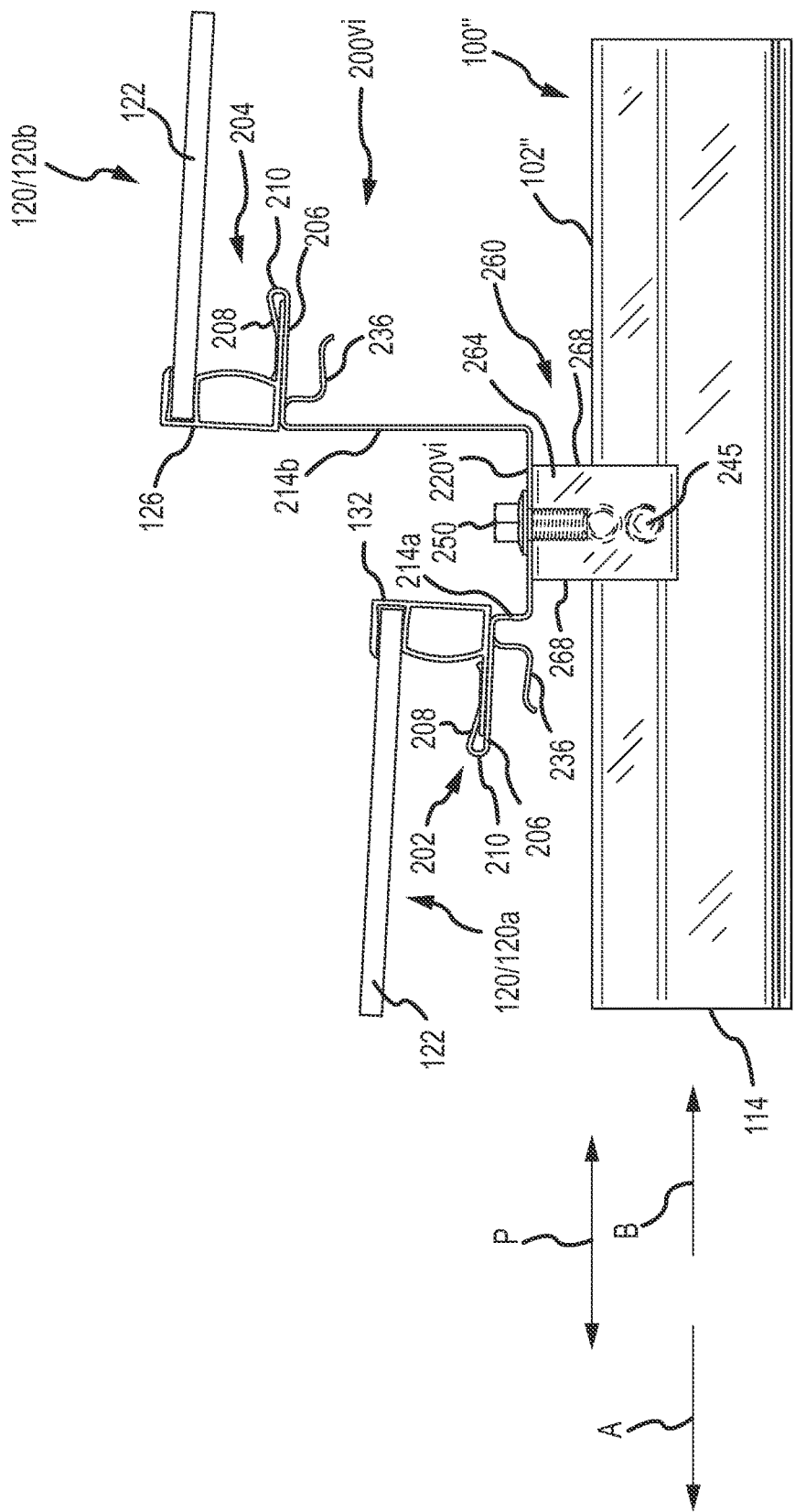
FIG. 8G is a side view of the photovoltaic assembly of FIG. 8A, with the module flanges of each photovoltaic module being engaged by its corresponding mounting clip of the module bracket.
Figure 9A:
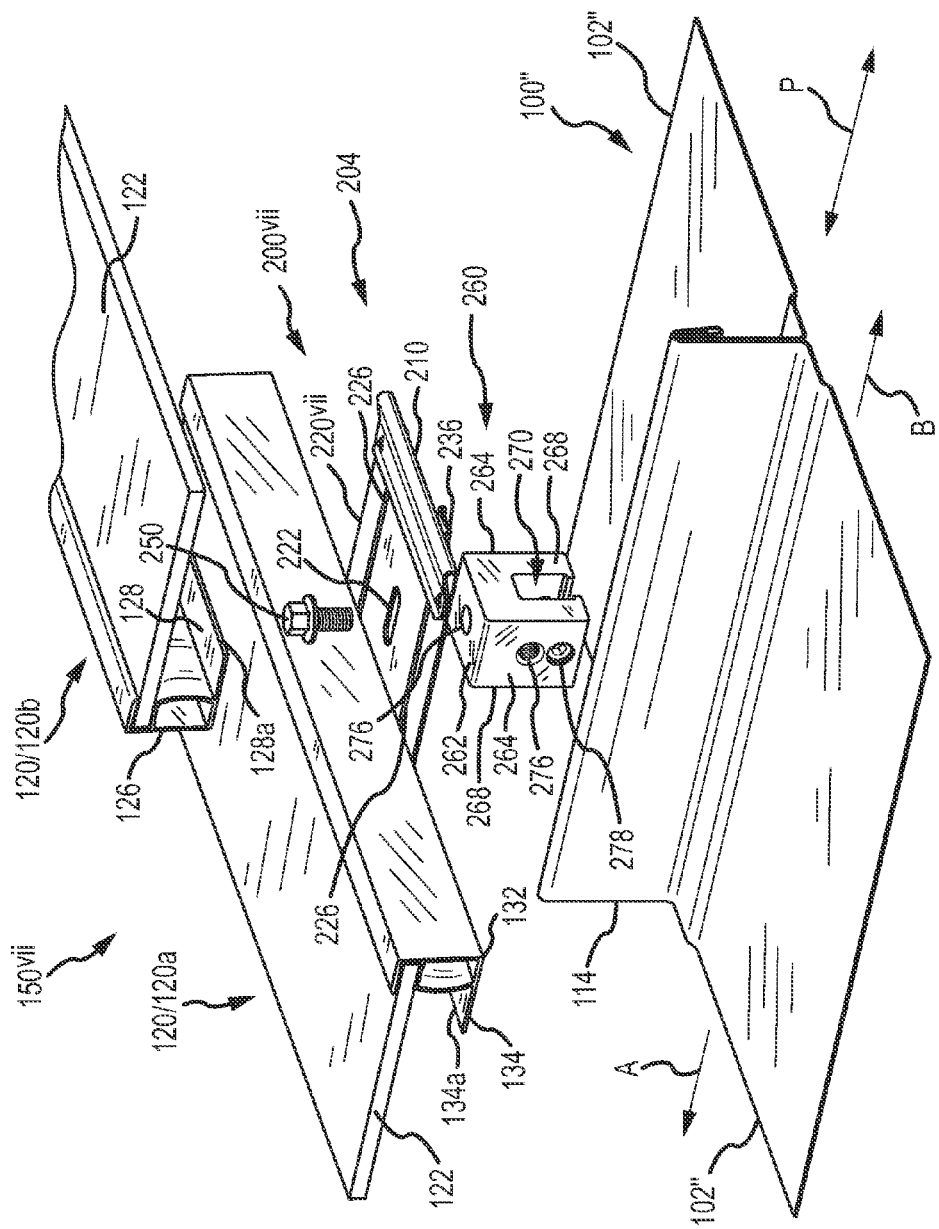
FIG. 9A is an exploded, perspective view of one embodiment of a photovoltaic assembly installed on a standing seam roofing surface, where the photovoltaic assembly uses an adaptation of the module bracket from the photovoltaic assembly of FIGS. 4A-G.
Figure 9B:
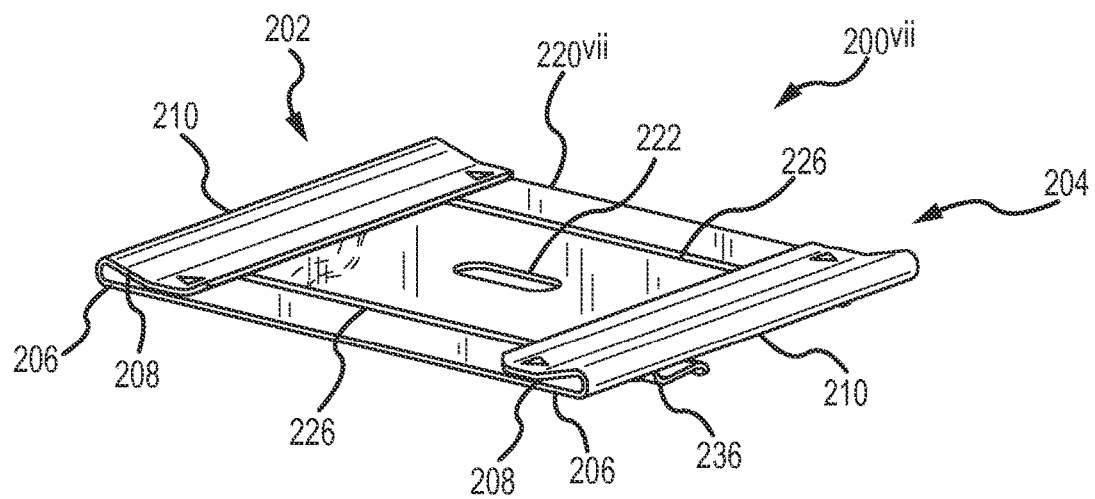
FIG. 9B is a perspective view of the module bracket used by the photovoltaic assembly of FIG. 9A.

FIG. 5 presents another embodiment of a photovoltaic assembly $150^{iii}$ that utilizes a variation of the module bracket $200^{i}$ discussed above in relation to FIG. 3. Those portions of the module bracket $200^{iii}$ of FIG. 5 that differ from the module bracket $200^{i}$ of FIG. 3 are identified by a superscripted "iii". Unless otherwise noted, the discussion presented above with regard to the module brackets 200 and $200^{i}$ is applicable to the module bracket $200^{iii}$.

The module bracket $200^{iii}$ of FIG. 5 is configured to dispose the mounting clips 202, 204 at different elevations from the roofing surface 100' (e.g., the mounting clips 202, 204 are spaced a different distance from a reference plane that at least generally contains the end section 106 of the ribs 104 for the roofing surface 100'). In this regard, the two riser sections 214a, 214b are of different lengths in the case of the module bracket $200^{iii}$ (the riser sections 214a, 214b may continue to be at least generally parallel to one another, and may continue to be at least generally perpendicular to the base section $220^{i}$). In the illustrated embodiment, the riser section 214a that extends between the base section $220^{i}$ and the first mounting clip 202 is shorter than the riser section 214b that extends between the base section $220^{i}$ and the second mounting clip 204, although this could be reversed. That is and for the illustrated embodiment, the second mounting clip 204 is disposed at a higher elevation than the first mounting clip 202 (measured relative to a reference plane that contains the end sections 106 of the ribs 104 for the roofing surface 100'). This may be used to dispose the photovoltaic modules 120a, 120b engaged by the module bracket $200^{iii}$ at an angle relative to the roofing surface 100' (e.g., so the modules 120a, 120b are disposed in non-parallel relation to the roofing surface 100').

Whichever of the mounting clips 202, 204 is disposed at the lowest elevation in the case of the module bracket $200^{iii}$ (measured orthogonally to the pitch P of the roofing surface 100'), this mounting clip 202, 204 is still offset from the base section $220^{i}$ by a distance of at least about 0.5" in one embodiment, and by a distance of at least about 0.75" in another embodiment. As such, each of the mounting clips 202, 204 may be offset from the base section $220^{i}$ by a distance of at least about 0.5" in one embodiment, and by a distance of at least about 0.75" in another embodiment, to provide the enhanced spacing advantages discussed above with regard to the embodiment of FIGS. 2A-L.

Although not shown in FIG. 5, the module bracket $200^{iii}$ could utilize the stiffeners 226 discussed above in relation to the module bracket 200. In one variation of the module bracket $200^{iii}$ (not shown), the bracket flanges 230 could be eliminated and the module bracket $200^{iii}$ could be attached to the rib 104 of the roofing surface 100' in the manner of the embodiment of FIGS. 2A-L. In another variation of the module bracket $200^{iii}$ (not shown), the bracket flanges 230 could be retained, but the module bracket $200^{iii}$ could be attached to the rib 104 of the roofing surface 100' in the manner of the embodiment of FIGS. 2A-L (e.g., not using any panel fasteners 238 in conjunction with the bracket flanges 230).

FIGS. 6A-L present another embodiment of a photovoltaic assembly $150^{iv}$ that may utilize the same module bracket 200 discussed above in relation to FIGS. 2A-L, but a different manner of maintaining the module bracket 200 is a fixed position relative to the roofing surface 100'. Generally, a separate panel bracket 240 is positioned over the module bracket 200 when positioned on a rib 104 of the roofing surface 100', and the panel bracket 240 is instead anchored to this rib 104. As such, the module bracket 200 in the embodiment of FIGS. 6A-L could eliminate the fastener apertures 228 that extend through the base section 220, as they are not utilized in this configuration. The panel bracket 240 could also be used with the module bracket $200^{ii}$ discussed above in relation to FIGS. 4A-G, as well as with the module bracket $200^{vi}$ that will be discussed below in relation the FIGS. 8A-G (but for installations on the roofing surface 100', versus the roofing surface 100" shown in FIGS. 8A-G).

The panel bracket 240 used by the photovoltaic assembly $150^{iv}$ of FIGS. 6A-L includes a cap section 242 and a pair of bracket flanges $230^{iv}$ at least generally of the type used in the FIG. 3 embodiment discussed above. As the bracket flanges $230^{iv}$ do not extend from the base section 220, the bracket flanges $230^{iv}$ in FIGS. 6A-L are further identified by a superscripted "iv". A separate transition section 234 may interconnect the cap section 242 with the corresponding bracket flange $230^{iv}$. Each transition section 234 may be at least generally s-shaped.

The panel bracket 240 used by the photovoltaic assembly $150^{iv}$ of FIGS. 6A-L may be fabricated in any appropriate manner. For instance, the panel bracket 240 could be of a one-piece construction (e.g., having the cap section 242 (which may include a wiring clip 236) and the two bracket flanges $230^{iv}$ being integrally formed from a piece of sheet metal). Alternatively, each of the bracket flanges $230^{iv}$ could be separately formed and separately attached to the opposing sides of the cap section 242 in any appropriate manner.

The module bracket 200 may be positioned on the upper section 106 of one of the ribs 104 for the roofing surface 100'. The panel bracket 240 may then be positioned over the module bracket 200, such that the base section 220 of the module bracket 200 is disposed (e.g., sandwiched) between the cap section 242 of the panel bracket 240 and the end section 106 of one of the ribs 104. One of the bracket flanges $230^{iv}$ will then be positioned alongside at least an upper portion of one of the sidewalls 108 of the rib 104, while the other of the bracket flanges $230^{iv}$ will be positioned alongside at least an upper portion of the other of the sidewalls 108 of this same rib 104. Again, a gasket $216^{i}$ may be positioned between one of the bracket flanges $230^{iv}$ and its corresponding sidewall 108 of the rib 104, while another gasket 216$^i$ may be positioned between the other of the bracket flanges 230$^{iv}$ and its corresponding sidewall 108 of the rib 104.

Each bracket flange 230$^{iv}$ may include one or more fastener apertures 232 (two in the illustrated embodiment). At least one panel fastener 238 (two in the illustrated embodiment) may be directed through one of the bracket flanges 230$^{iv}$ (e.g., through a corresponding fastener aperture 232), through any corresponding gasket 216$^i$, through a corresponding portion of the sidewall 108 of the rib 104, and may terminate within the hollow interior 110 of the rib 104. At least one panel fastener 238 (two in the illustrated embodiment) may be directed through the other of the bracket flanges 230$^{iv}$ (e.g., through a corresponding fastener aperture 232), through any corresponding gasket 216$^i$, through a corresponding portion of the sidewall 108 of the rib 104, and may terminate within the hollow interior 110 of the rib 104. As such, the base section 220 of the module bracket 200 need not include any fastener apertures 232.

FIGS. 7A-G present another embodiment of a photovoltaic assembly 150$^v$ that may utilize a module bracket similar to that used by the embodiment of FIGS. 2A-L, but which has been adapted for use with another type of roofing surface. The roofing surface 100" associated with the photovoltaic assembly 150$^v$ is defined by a plurality of panels 102" that are appropriately interconnected (e.g., one edge or edge portion of one panel 102" may be "nested" or interlocked with an adjacent panel 102" in the same row). Each adjacent pair of panels 102" of the roofing surface 100" is interconnected in a manner so as to define a standing seam 114. A base may be disposed between the opposing edges of each panel 102". The entirety of this base may be flat or planar. However, one or more small structures may be formed/shaped into the base of one or more panels 102" of the building surface 100", for instance one or more crests, minor ribs, intermediate ribs, pencil ribs, striations, fluting, flutes, or the like.

The module brackets 200$^v$ used by the photovoltaic assembly 150$^v$ of FIGS. 7A-G are not directly attached to the roofing surface 100", in contrast to the embodiments of FIGS. 2A-6L. Instead, a mounting device 260 is attached to a standing seam 114 of the roofing surface 100", and the module bracket 200$^v$ is attached to this mounting device 260.

The mounting device 260 includes an upper surface 262, an oppositely disposed lower or bottom surface 266, a pair of oppositely disposed side surfaces 264, and a pair of oppositely disposed ends 268. A slot 270 extends between the two ends 268 of the mounting device 260. At least an upper portion of a standing seam 114 may be received in this slot 270. At least one threaded hole 278 extends from one of the side surfaces 264 to the slot 270. Multiple threaded holes 278 (that extend to the slot 270) could be provided on a given side surface 264. At least one threaded hole 278 could extend from one of the side surfaces 264 of the mounting device 260 to the slot 270, and at least one threaded hole 278 could extend from the other of the side surfaces 264 of this mounting device 260 to the slot 270. In any case, at least one seam fastener 245 may be threadably engaged with the mounting device 260 (e.g., via a corresponding threaded hole 278), and may extend into the slot 270 to engage a standing seam 114 disposed therein. The end of each seam fastener 245 that engages a standing seam 114 disposed in the slot 270 may be configured so as to not penetrate or puncture the roofing surface 100" (e.g., having a rounded or convexly-shaped end). As such, one or more seam fasteners 245 may be used to attach the mounting device 260 to the roofing surface 100" (more specifically, to attach the mounting device 260 to one of the standing seams 114 of the roofing surface 100").

The standing seam 114 of the building surface 100" is commonly referred to as a vertical standing seam configuration. The upper surface 262 of the mounting device 260 may include at least one flat section for interfacing with the module bracket 200$^v$ (more specifically, the base section 220$^v$ of the module bracket 200$^v$). This upper surface 262 may also include a threaded hole 276 for interconnecting the module bracket 200$^v$ with the mounting device 260 when installed on the vertical standing seam 114. However, the mounting device 260 may also be used to install the module bracket 200$^v$ on what is commonly referred to as a horizontal standing seam configuration (e.g., where an end section of the standing seam may be disposed at least generally parallel with the pitch of the roofing surface). In this regard, at least one of the side surfaces 264 of the mounting device 260 may include at least one flat section and at least one threaded hole 276. In this instance, the base section 220$^v$ of the module bracket 220$^v$ would be disposed on such a side surface 264 of the mounting device 260.

With the base section 220$^v$ of the module bracket 200$^v$ being positioned on the upper surface 262 of the mounting device 260 (or on the noted side surface 264 in the case of a horizontal standing seam configuration), a threaded fastener 250 (e.g., a bolt) may be directed through an elongated slot 222 on the base section 220$^v$ of the module bracket 200$^v$, and may be threaded onto the mounting device 260 via a threaded hole 276. Any appropriate aperture may extend through the base section 220$^v$ of the module bracket 200$^v$. However, the elongated slot 222 in the illustrated embodiment provides for at least some level of adjustment of the relative position between the module bracket 200$^v$ and the mounting device 260 prior to disposing the threaded fastener 250 in a position that clamps the module bracket 200$^v$ onto the mounting device 260. In any case, the mounting clips 202, 204 will now be disposed in spaced relation to the roofing surface 100" (e.g., above or in overlying relation to the standing seam 114 to which the module bracket 200$^v$ is interconnected via a mounting device 260).

FIGS. 8A-G present another embodiment of a photovoltaic assembly 150$^{vi}$. Generally, the photovoltaic assembly 150$^{vi}$ adapts the module bracket 200$^{iii}$ from the embodiment of FIG. 5 for use with the roofing surface 100" from the embodiment of FIGS. 7A-G. The base section 220$^{vi}$ of the module bracket 200$^{vi}$ includes an elongated aperture 222 of the type discussed above in relation to the embodiment of FIGS. 7A-G. However, since the module bracket 200$^{vi}$ presented in FIGS. 8A-G does not show a pair of stiffening beads or stiffeners 226, the superscripted "vi" notation is used for its base section 220$^{vi}$ (although stiffeners 226 could be used by the module bracket 200$^{vi}$). Otherwise, the module bracket 200$^{vi}$ for the photovoltaic assembly 150$^{vi}$ may be installed on a standing seam 114 in accordance with the discussion of FIGS. 7A-G. Other than the manner of attachment, the discussion presented above with regarding to the embodiment of FIG. 5 is applicable to the embodiment of FIGS. 8A-G (and vice versa).

Whichever of the mounting clips 202, 204 is disposed at the lowest elevation in the case of the module bracket 200$^{vi}$ (measured orthogonally to the pitch P of the roofing surface 100"), this mounting clip 202, 204 is still offset from the base section 220$^{vi}$ by a distance of at least about 0.5" in one embodiment, and by a distance of at least about 0.75" in one embodiment. As such, each of the mounting clips 202, 204 may be offset from the base section 220$^{vi}$ by a distance of at least about 0.5" in one embodiment, and by a distance of at least about 0.75" in another embodiment, to provide the enhanced spacing advantages discussed above with regard to the embodiment of FIGS. 2A-L.

FIGS. 9A-G present another embodiment of a photovoltaic assembly $150^{vii}$. Generally, the photovoltaic assembly $150^{vii}$ adapts the module bracket $200^{ii}$ from the embodiment of FIGS. 4A-G for use with the roofing surface 100" from the embodiment of FIGS. 7A-G. The base section $220^{vii}$ of the module bracket $200^{vii}$ includes an elongated aperture 222 of the type discussed above in relation to the embodiment of FIGS. 7A-G. Otherwise, the module bracket $200^{vii}$ for the photovoltaic assembly $150^{vii}$ may be installed on a standing seam in accordance with the discussion of FIGS. 7A-G. Other than the manner of attachment, the discussion presented above with regarding to the embodiment of FIGS. 4A-G is applicable to the embodiment of FIGS. 9A-G (and vice versa). However and since a mounting device 260 is used by the photovoltaic assembly $150^{vii}$ in FIGS. 9A-G, the mounting clips 202, 204 for the module bracket $220^{vii}$ will be maintained in spaced relation to the roofing surface 100" (more specifically, disposed in spaced relation to the upper end of the standing seam 114 to which the module bracket $220^{vii}$ is interconnected).

A number of observations may be made with regard to the module bracket $200^{vii}$ in relation to installing photovoltaic modules on the roofing surface 100". As the mounting clips 202, 204 are not offset from the base section 220 in the case of the module bracket $200^{vii}$, the module bracket $200^{vii}$ does not provide the spacing provided by the embodiment of FIGS. 2A-L (although the use of the mounting device 260 does provide some level of enhanced spacing for the embodiment of FIGS. 9A-G). However, the entirety of the retention forces exerted by the module bracket $200v^{ii}$ on the photovoltaic modules 120a, 120b continues to be provided by the mounting clips 202, 204 (no other forces are used to retain the modules 120a, 120b on the module bracket $200^{vii}$). Moreover, the mounting clip 202 may exert a compressive force on the second module flange 134 of the photovoltaic module 120a. Similarly, the mounting clip 204 may exert a compressive force on the first module flange 128 of the photovoltaic module 120b. As the module bracket $200^{vii}$ also includes at least one least one electrical contact 218 for each of the mounting clips 202, 204, the corresponding discussion presented above with regard to the embodiment of FIGS. 2A-L is equally applicable to the embodiment of FIGS. 9A-G.

One embodiment of a method for installing photovoltaic modules will be addressed with regard to the embodiment of FIG. 2A-2L. It should be appreciated that this installation method is applicable to all embodiments described herein. Although this installation method will be described with regard to the building surface 100', it is equally applicable to the building surface 100" as well.

A plurality of first module brackets 200 may be installed in the above-noted manner on the roofing surface 100'. As discussed above, the first mounting clip 202 of each module bracket 200 is installed on the building surface 100' in the up-slope direction A from its corresponding second mounting clip 204. The noted first module brackets 200 may be installed in a first row on the roofing surface 100', where this first row extends at least generally transverse to the pitch P of the roofing surface 100' (e.g., "across" the roofing surface 100; along a line that is disposed at a common elevation on the roofing surface 100'). Any appropriate spacing may be utilized between adjacent pairs of first module brackets 200.

At least one second module bracket 200 (and more typically a plurality of second module brackets 200) may be installed on the second module flange 134 of the photovoltaic module 120a. More specifically, the first mounting clip 202 of each second module bracket 200 being installed on the photovoltaic module 120a may be slid onto the second module flange 134 of the photovoltaic module 120a (e.g., the second module flange 134 may be directed/slid between the first section 206 and its corresponding second section 208 of the first mounting clip 202 for each second module bracket 200 being installed on the photovoltaic module 120a).

The photovoltaic module 120a may be installed on at least one of the first module brackets 200 in the first row (typically at least two of the first module brackets 200 in the first row, and again that have been previously anchored relative to the roofing surface 100'). Initially, the first module flange 128 of the photovoltaic module 120a may be positioned in the space between the first mounting clip 202 and the second mounting clip 204 of at least one of the first module brackets 200 in the first row. Thereafter, the first module flange 128 of the photovoltaic module 120a may be moved in the down-slope direction B to slide into the second mounting clip 204 of at least one of the first module brackets 200 in the first row (e.g., the first module flange 128 may be directed/slid between the first section 206 and its corresponding second section 208 of the second mounting clip 204 for each first module bracket 200 being used to install the photovoltaic module 120a on the roofing surface 100'). The first module flange 128 of the photovoltaic module 120a may be simultaneously slid into the second mounting clip 204 of two or more of the first module brackets 200 in the first row. In any case, movement of the photovoltaic module 120a in the down-slope direction B may be terminated by the free end 128a of first module flange 128 of the photovoltaic module 120a engaging the end section 210 of the second mounting clip 204 for one or more of the first module brackets 200 in the first row.

After the photovoltaic module 120a has been installed on the first module brackets 200 in the first row in the above-noted manner, each second module bracket 200 (that was previously installed on the second module flange 134 of the photovoltaic module 120a) may be repositioned along this second module flange 134 (by sliding any given second module bracket 200 along the length dimension of the second module flange 134 for the photovoltaic module 120a) to align such a second module bracket 200 with the desired rib 104 of the roofing surface 100' (if required). Each second module bracket 200 on the second module flange 134 of the photovoltaic module 120a may also be slid in the down-slope direction B until the free end 134a of this second module flange 134 engages the end section 210 of its first mounting clip 202. In any case and with the second module brackets 200 being appropriately engaged with the second module flange 134 of the photovoltaic module 120a and also in the desired position relative to the roofing surface 100', each of the second module brackets 200 on the second module flange 134a of the photovoltaic module 120a may be attached to the roofing surface 100' in the above-noted matter. These second module brackets 200 may extend in a second row on the roofing surface 100', where this second row extends at least generally transverse to the pitch P of the roofing surface 100' (e.g., "across" the roofing surface 100; along a line that is disposed at a common elevation on the roofing surface 100'), and where this second row for the second module brackets 200 is at least generally parallel with the noted first row for the first module brackets 200.

A variation of the foregoing would be to install the first mounting clip 202 of one or more of the second module brackets 200 on the second module flange 134 of the photovoltaic module 120 after installing the first module flange 128 of the photovoltaic module 120 on one or more of the first module brackets 200 (again, that have already been attached to the roofing surface 100'), and thereafter anchor each such second module bracket 200 (on the second module flange 134 of the photovoltaic module 120a) relative to the roofing surface 100'. The foregoing may be repeated any appropriate number of times to install a column of photovoltaic modules 120 "down" the pitch P of the roofing surface 100', where the column would extend in the dimension of the pitch P of the roofing surface 100' and where each subsequently installed photovoltaic module 120 in the column would be in the down-slope direction B from all previously installed photovoltaic modules 120 in the same column. Multiple columns of photovoltaic modules 120 could be installed on the roofing surface 100' in the above-noted manner as well (which could then define an array of photovoltaic modules 120 on the roofing surface 100', where this array would be in the form of a plurality of rows and a plurality of columns). As the embodiments were described herein with regard to a pair of photovoltaic modules 120 being installed on a common module bracket, at least part of the installation of a down-slope photovoltaic module on this module bracket (e.g., the second photovoltaic module 120b) will be described.

Subsequent in time to each of the following: 1) the first module flange 128 of the photovoltaic module 120a having been positioned in the second mounting clip 204 of one or more first module brackets 200 in the first row in the above-noted manner (where each such first module bracket 200 was previously anchored relative to the roofing surface 100'); 2) the second module flange 134 of the photovoltaic module 120a having been positioned in the first mounting clip 202 of one or more second module brackets 200 in the second row in the above-noted manner; and 3) each such second module bracket 200 having been anchored relative to the roofing surface 100; the photovoltaic module 120b may be installed on at least one of the second module brackets 200 in the second row (typically at least two of the second module brackets 200 in the second row). Initially, the first module flange 128 of the photovoltaic module 120b may be positioned in the space between the first mounting clip 202 and the second mounting clip 204 of at least one of the second module brackets 200 in the second row. Thereafter, the first module flange 128 of the photovoltaic module 120b may be moved in the down-slope direction B to slide into the second mounting clip 204 of at least one of the second module brackets 200 in the second row (e.g., the first module flange 128 may be directed/slid between the first section 206 and its corresponding second section 208 of the second mounting clip 204 for each second module bracket 200 being used to install the photovoltaic module 120b on the roofing surface 100'). The first module flange 128 may be simultaneously slid into the second mounting clip 204 of two or more of the second module brackets 200 in the second row. Movement of the photovoltaic module 120b in the down-slope direction B may be terminated by the free end 128a of first module flange 128 of the photovoltaic module 120b engaging the end section 210 of the second mounting clip 204 for one or more of the second module brackets 200 in the second row. One or more third module brackets 200 may be installed on the second module flange 134 of the second photovoltaic module 120b in the manner discussed above regarding the second module brackets 200 and the second module flange 134 of the first photovoltaic module 120a, and may then be anchored relative to the roofing surface 100' to complete the installation of the photovoltaic module 120b (e.g., to dispose such third module brackets 200 in a third row that is at least generally parallel to the noted first row for the first module brackets 200).

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed:

1. A photovoltaic assembly, comprising:
  a roofing surface;
  a module bracket interconnected with said roofing surface and comprising a base section that is positioned in overlying relation to said roofing surface, first and second mounting clips that are disposed in spaced relation to one another, a first riser section extending between one end of said base section and said first mounting clip that offsets said first mounting clip from and disposes said first mounting clip at a higher elevation than said base section relative to said roofing surface, a second riser section extending between an opposite end of said base section and said second mounting clip that offsets said second mounting clip from and disposes said second mounting clip at a higher elevation than said base section relative to said roofing surface, wherein said first mounting clip comprises a first inlet and a first closed end, wherein said second mounting clip comprises a second inlet and a second closed end, wherein said first inlet of said first mounting clip is located between said second mounting clip and said first closed end of said first mounting clip, wherein said second inlet of said second mounting clip is located between said first mounting clip and said second closed end of said second mounting clip, wherein said first and second mounting clips each comprise first and second sections, wherein said second section of each of said first and second mounting clips is disposed in overlying relation to said first section of said first and second mounting clips, respectively, wherein said first and second inlets are disposed between said first and second sections of said first and second mounting clips, respectively, wherein said first riser section extends from said base section to said first section of said first mounting clip such that a lower surface of said first section of said first mounting clip is at a higher elevation than a lower surface of said base section, relative to said roofing surface, and such that there is a first open space that extends from said lower surface of said first section of said first mounting clip to said roofing surface, and wherein said second riser section extends from said base section to said first section of said second mounting clip such that a lower surface of said first section of said second mounting clip is at a higher elevation than said lower surface of said base section, relative to said roofing surface, and such that there is a second open space that extends from said lower surface of said first section of said second mounting clip to said roofing surface; and at least one photovoltaic module comprising a first frame section positioned on a first perimeter section of said photovoltaic module and a second frame section positioned on an oppositely disposed second perimeter section of said photovoltaic module, wherein said first frame section comprises a first module flange that cantilevers at least generally in a direction of said second perimeter section, wherein said second frame section comprises a second module flange that cantilevers at least generally in a direction of said first perimeter section, wherein said at least one photovoltaic module comprises first and second photovoltaic modules, wherein said second module flange of said first photovoltaic module extends through said first inlet and is engaged by said first and second sections of said first mounting clip, and wherein said first module flange of said second photovoltaic module extends through said second inlet and is engaged by said first and second sections of said second mounting clip.

2. The photovoltaic assembly of claim 1, wherein said first and second frame sections of said first photovoltaic module and said first and second frame sections of said second photovoltaic module are each disposed at least substantially transverse to a pitch of said roofing surface, wherein said first frame section of said first photovoltaic module is disposed up-slope of both said second frame section of said first photovoltaic module and an entirety of said second photovoltaic module, and wherein said first frame section of said second photovoltaic module is disposed up-slope of said second frame section of said second photovoltaic module.

3. The photovoltaic assembly of claim 1, wherein said first and second mounting clips are spaced along a pitch of said roofing surface.

4. The photovoltaic assembly of claim 1, wherein said module bracket comprises first and second stiffeners that each extend along said first section of said first mounting clip, along said first riser section, along said base section, along said second riser section, and along said first section of said second mounting clip.

5. The photovoltaic assembly of claim 4, wherein said first and second stiffeners each protrude from a surface of said base section that projects toward said roofing surface.

6. The photovoltaic assembly of claim 1, wherein said second section of each of said first and second mounting clips is deflectable away from its corresponding said first section, wherein said first and second sections of said first mounting clip are biased toward one another, and wherein said first and second sections of said second mounting clip are biased toward one another.

7. The photovoltaic assembly of claim 6, wherein said first and second closed ends of said first and second mounting clips, respectively, each comprise an arcuately-shaped pliable section located between its corresponding said first and second sections.

8. The photovoltaic assembly of claim 1, wherein said roofing surface comprises a hollow rib, and wherein said base section is positioned in overlying relation to an uppermost section of said hollow rib.

9. The photovoltaic assembly of claim 8, wherein at least one threaded fastener extends through said base section, through said uppermost section of said hollow rib, and terminates within an interior space of said hollow rib.

10. The photovoltaic assembly of claim 8, wherein said module bracket comprises first and second bracket flanges disposed on opposite sides of said base section, wherein said first bracket flange is disposed against a first side of said hollow rib, wherein said second bracket flange is disposed against a second side of said hollow rib, wherein at least one threaded fastener extends through said first bracket flange and said first side of said hollow rib, and wherein at least one threaded fastener extends through said second bracket flange and said second side of said hollow rib.

11. The photovoltaic assembly of claim 10, wherein said first and second bracket flanges are permanently anchored relative to said base section.

12. The photovoltaic assembly of claim 10, wherein said base section comprises at least one wiring clip.

13. The photovoltaic assembly of claim 1, further comprising:
    a mounting device attached to said roofing surface, wherein said module bracket is positioned on said mounting device; and
    at least one threaded fastener that extends through said module bracket and into said mounting device.

14. The photovoltaic assembly of claim 13, wherein said roofing surface comprises a standing seam, and wherein said mounting device is mounted on said standing seam.

15. The photovoltaic assembly of claim 13, wherein said base section is positioned on said mounting device.

16. The photovoltaic assembly of claim 1, wherein said first and second mounting clips are at least substantially coplanar with one another.

17. The photovoltaic assembly of claim 1, wherein said second mounting clip is offset from and at a higher elevation than said first mounting clip.

18. The photovoltaic assembly of claim 1, wherein said base section comprises a wiring clip.

19. The photovoltaic assembly of claim 1, wherein said offset between said base section and each of said first and second mounting clips is at least about 0.5".

20. The photovoltaic assembly of claim 1, wherein said first riser section and said second riser section are at least generally parallel to one another and are each disposed at least generally perpendicular to said base section.

21. The photovoltaic assembly of claim 1, wherein said first and second mounting clips each comprise at least one wiring clip, and wherein said at least one wiring clip for each of said first and second mounting clips is disposed on a side of the corresponding said first and second said mounting clip that faces said roofing surface.

22. The photovoltaic assembly of claim 1, further comprising:
    a first slide fit between said second module flange of said first photovoltaic module and said first mounting clip; and
    a second slide fit between said first module flange of said second photovoltaic module and said first mounting clip.

23. The photovoltaic assembly of claim 1, wherein contact between said module bracket and said first photovoltaic module is limited to said first mounting clip engaging said second module flange of said first photovoltaic module, and wherein contact between said module bracket and said second photovoltaic module is limited to said second mounting clip engaging said first module flange of said second photovoltaic module.

24. The photovoltaic assembly of claim 1, wherein an entirety of a retention force exerted by said module bracket on said first photovoltaic module is provided by said first mounting clip, and wherein an entirety of a retention force exerted by said module bracket on said second photovoltaic module is provided by said second mounting clip.

25. The photovoltaic assembly of claim 1, wherein said first mounting clip exerts a compressive force on said second module flange of said first photovoltaic module, and wherein said second mounting clip exerts a compressive force on said first module flange of said second photovoltaic module.

26. The photovoltaic assembly of claim 1, wherein each of said first and second mounting clips comprise at least one electrical contact.

27. The photovoltaic assembly of claim 26, wherein each said electrical contact is in the form of a cantilever, wherein said each said mounting clip comprises a second section that is disposed above a first section, and a closed end that is disposed opposite of a corresponding said inlet, wherein each said second section comprises at least one said electrical contact, wherein each said electrical contact extends from a corresponding second section of the corresponding said mounting clip, both at least generally in the direction of a corresponding said first section of the corresponding said mounting clip and in the direction of said closed end of the corresponding said mounting clip.

* * * * *